United States Patent
Kim et al.

(10) Patent No.: US 12,308,253 B2
(45) Date of Patent: May 20, 2025

(54) MOLDED PRODUCT FOR SEMICONDUCTOR STRIP AND METHOD OF MANUFACTURING SEMICONDUCTOR PACKAGE

(71) Applicant: Samsung Electronics Co., Ltd., Suwon-si (KR)

(72) Inventors: Seunghwan Kim, Sejong-si (KR); Kyonghwan Koh, Asan-si (KR); Jungjoo Kim, Hwaseong-si (KR); Jongwan Kim, Cheonan-si (KR); Junwoo Park, Asan-si (KR); Hyunggil Baek, Suwon-si (KR); Yongkwan Lee, Hwaseong-si (KR); Dongju Jang, Asan-si (KR); Taejun Jeon, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 492 days.

(21) Appl. No.: 17/862,662

(22) Filed: Jul. 12, 2022

(65) Prior Publication Data
US 2023/0127641 A1    Apr. 27, 2023

(30) Foreign Application Priority Data
Oct. 25, 2021  (KR) .................... 10-2021-0142517

(51) Int. Cl.
*H01L 21/00* (2006.01)
*H01L 21/56* (2006.01)
(Continued)

(52) U.S. Cl.
CPC .......... *H01L 21/566* (2013.01); *H01L 21/561* (2013.01); *H01L 21/563* (2013.01);
(Continued)

(58) Field of Classification Search
None
See application file for complete search history.

(56) References Cited

U.S. PATENT DOCUMENTS

| 7,604,469 B2 * | 10/2009 | Chang ................ B29C 45/73 425/127 |
| 9,293,383 B2 | 3/2016 | Suzuki et al. |

(Continued)

FOREIGN PATENT DOCUMENTS

| JP | 2011/0210894 A | 10/2011 |
| JP | 6000519 B2 | 9/2016 |

(Continued)

*Primary Examiner* — Nicholas J Tobergte
(74) *Attorney, Agent, or Firm* — HARNESS, DICKEY & PIERCE, P.L.C.

(57) ABSTRACT

A method of manufacturing a semiconductor package may include providing a substrate having first and second cutting regions respectively provided along first and second side portions opposite to each other and a mounting region between the first and second cutting regions is provided, disposing at least one semiconductor chip on the mounting region, forming a molding member on the substrate, and removing a dummy curl portion and at least portions of dummy runner portions from the molding member. The molding member may include a sealing portion, the dummy curl portion provided outside the second side portion of the substrate, and the plurality of dummy runner portions on the second cutting region to connect the sealing portion and the dummy curl portion. The substrate may include adhesion reducing pads in the second cutting region, which may contact the dummy runner portions respectively.

20 Claims, 31 Drawing Sheets

(51) Int. Cl.
  *H01L 23/00*    (2006.01)
  *H01L 23/31*    (2006.01)
  *H01L 23/498*   (2006.01)
  *H01L 25/10*    (2006.01)
  H01L 21/48      (2006.01)
  H01L 21/67      (2006.01)

(52) U.S. Cl.
  CPC .... *H01L 23/3142* (2013.01); *H01L 23/49816* (2013.01); *H01L 23/49833* (2013.01); *H01L 23/49838* (2013.01); *H01L 23/49894* (2013.01); *H01L 24/96* (2013.01); *H01L 24/97* (2013.01); *H01L 25/105* (2013.01); *H01L 21/4857* (2013.01); *H01L 21/67126* (2013.01); *H01L 23/49822* (2013.01); *H01L 24/16* (2013.01); *H01L 24/32* (2013.01); *H01L 24/48* (2013.01); *H01L 24/73* (2013.01); *H01L 2224/16237* (2013.01); *H01L 2224/32225* (2013.01); *H01L 2224/48225* (2013.01); *H01L 2224/73204* (2013.01); *H01L 2224/9511* (2013.01); *H01L 2225/1023* (2013.01); *H01L 2225/1041* (2013.01); *H01L 2225/107* (2013.01); *H01L 2924/1431* (2013.01); *H01L 2924/1436* (2013.01); *H01L 2924/1438* (2013.01); *H01L 2924/1811* (2013.01); *H01L 2924/1815* (2013.01); *H01L 2924/182* (2013.01); *H01L 2924/183* (2013.01); *H01L 2924/186* (2013.01)

(56) References Cited

U.S. PATENT DOCUMENTS

| | | |
|---|---|---|
| 11,049,805 B2 | 6/2021 | Pan et al. |
| 2006/0216867 A1 | 9/2006 | Kawata et al. |
| 2021/0327806 A1 | 10/2021 | Pan et al. |

FOREIGN PATENT DOCUMENTS

| | | |
|---|---|---|
| KR | 102172867 B1 | 11/2020 |
| KR | 102259707 B1 | 6/2021 |

* cited by examiner

MOLDED PRODUCT FOR SEMICONDUCTOR STRIP AND METHOD OF MANUFACTURING SEMICONDUCTOR PACKAGE

PRIORITY STATEMENT

This application claims priority under 35 U.S.C. § 119 to Korean Patent Application No. 10-2021-0142517, filed on Oct. 25, 2021 in the Korean Intellectual Property Office (KIPO), the contents of which are herein incorporated by reference in their entirety.

BACKGROUND

1. Field

Some example embodiments relate to a molded product for a semiconductor package and/or a method of manufacturing a semiconductor package using the same. More particularly, some example embodiments relate to a molded product for a semiconductor strip for manufacturing a semiconductor package and/or a method for manufacturing a semiconductor package using the same.

2. Description of the Related Art

In semiconductor package manufacturing processes, a plurality of individual semiconductor chips from a wafer may be mounted on a substrate, and then a molding member for protecting the semiconductor chips from an external environment may be formed on the substrate by a molding apparatus. A semiconductor strip, on which the molding member is formed, may be loaded in a magazine and then transferred to an apparatus for a subsequent packaging process. However, a portion of cured resin (burr) is formed to protrude from an edge of the substrate of the molded semiconductor strip, and thus, the semiconductor strip may be caught on a transfer rail or inside the magazine, thereby causing defects in subsequent processes.

SUMMARY

Some example embodiments provide a molded product for a semiconductor strip capable of limiting and/or preventing resin burrs from occurring in an edge of a substrate after molding.

Some example embodiments provide a method of manufacturing a semiconductor package using the molded product for semiconductor strip.

According to an example embodiment, a method of manufacturing a semiconductor package may include providing a substrate, disposing at least one semiconductor chip on a mounting region of the substrate, and forming a molding member on the substrate. The substrate may have a first cutting region and a second cutting region respectively provided along a first side portion and a second side portion opposite each other and the mounting region between the first cutting region and the second cutting region. The substrate may include adhesion reducing pads in the second cutting region. The molding member may include a sealing portion on the mounting region of the substrate and covering the at least one semiconductor chip, a dummy curl portion outside the second side portion of the substrate, and a plurality of dummy runner portions on the second cutting region to connect the sealing portion and the dummy curl portion. The plurality of dummy runner portions may be on the adhesion reducing pads to reduce an adhesive force between the substrate and the plurality of dummy runner portions. The method may further include removing the dummy curl portion and at least portions of the dummy runner portions from the molding member.

According to an example embodiment, a method of manufacturing a semiconductor package may include providing a substrate, the substrate having a first side portion and a second side portion opposite each other and a plurality of adhesion reducing pads spaced apart from each other along the second side portion; disposing at least one semiconductor chip on the substrate; disposing the substrate in a mold defining a cavity, a plurality of dummy runners, and dummy curl in fluid communication with each other; and forming a molding member of the substrate. The cavity may be configured for receiving a sealing material for sealing the at least one semiconductor chip. The plurality of dummy runners may be configured to serve as pathways through which the sealing material may be discharged from the cavity and the dummy curl configured to be used for collecting the sealing material discharged through the dummy runners. The forming the molding member of the substrate may include injecting the sealing material into the cavity of the mold and using the dummy curl for collecting the sealing material discharged from the cavity through the plurality of dummy runners. The molding member may include a sealing portion that covers the at least one semiconductor chip, a dummy curl portion outside the second side portion of the substrate, and a plurality of dummy runner portions connecting the sealing portion and the dummy curl portion. The plurality of dummy runner portions respectively may contact portions of the adhesion reducing pads. The method may further include removing the dummy curl portion and at least portions of the plurality of dummy runner portions from the molding member.

According to an example embodiment, a molded product for a semiconductor strip may include a substrate having a first cutting region and a second cutting region respectively provided along a first side portion and a second side portion opposite each other and a mounting region between the first cutting region and the second cutting region; at least one semiconductor chip on the mounting region of the substrate; a molding member on the substrate; and a plurality of adhesion pads. The molding member may include a sealing portion on the mounting region of the substrate and covering the at least one semiconductor chip, a dummy curl portion outside the second side portion of the substrate, and a plurality of dummy runner portions provided on the second cutting region to connect the sealing portion and the dummy curl portion. The plurality of adhesion reducing pads may be along the second side portion in the second cutting region of the substrate. The plurality of adhesion reducing pads may contact the plurality of dummy runner portions respectively.

According to an example embodiment, a substrate may include a plurality of adhesion reducing pads arranged to be spaced apart from each other along a side portion. At least one semiconductor chip may be mounted on the substrate, and a molding member may be formed on the substrate to covering the semiconductor chip.

The molding member may include a sealing portion covering at least a portion of the semiconductor chip, a dummy curl portion provided outside the side portion of the substrate, and a plurality of dummy runner portions connecting the sealing portion and the dummy curl portion and coming into contact with the plurality of adhesion reducing pads respectively. The adhesion reducing pad may have a low bonding force with the dummy runner portion (e.g., sealing material resin).

Accordingly, when the dummy curl portion and at least portions of the dummy runner portions are removed together from the molding member, the adhesive force reducing pads may limit and/or prevent a sealing material burr from being generated on an edge of the substrate. Thus, it may be possible to limit and/or prevent a semiconductor strip including the substrate and the sealing portion from being caught in a transfer rail or a magazine by the burr to cause defects in subsequent processes.

BRIEF DESCRIPTION OF THE DRAWINGS

Example embodiments will be more clearly understood from the following detailed description taken in conjunction with the accompanying drawings.

FIG. 1 is a block diagram illustrating a molding system for manufacturing a semiconductor package in accordance with an example embodiment.

FIG. 2 is a cross-sectional view illustrating a molding apparatus in accordance with an example embodiment.

FIGS. 3 and 4 are cross-sectional views illustrating operations of molding a semiconductor chip on a substrate using the molding apparatus of FIG. 2.

FIG. 5 is a cross-sectional view illustrating a molded article for a semiconductor strip molded by the molding apparatus of FIG. 2.

FIG. 6 is a cross-sectional view illustrating a de-gating apparatus in accordance with an example embodiment.

FIGS. 7 and 8 are cross-sectional views illustrating operations of removing a curl portion and a dummy curl portion remaining in the molding member using the de-gating apparatus of FIG. 6.

FIGS. 9 to 19 are views illustrating a method of manufacturing a semiconductor package in accordance with an example embodiment.

FIGS. 20 and 21 are plan views illustrating an adhesion reducing pad in accordance with an example embodiment.

FIGS. 22 to 31 are views illustrating a method of manufacturing a semiconductor package in accordance with an example embodiment.

DETAILED DESCRIPTION OF EXAMPLE EMBODIMENTS

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments will be explained in detail with reference to the accompanying drawings.

Figure 1:
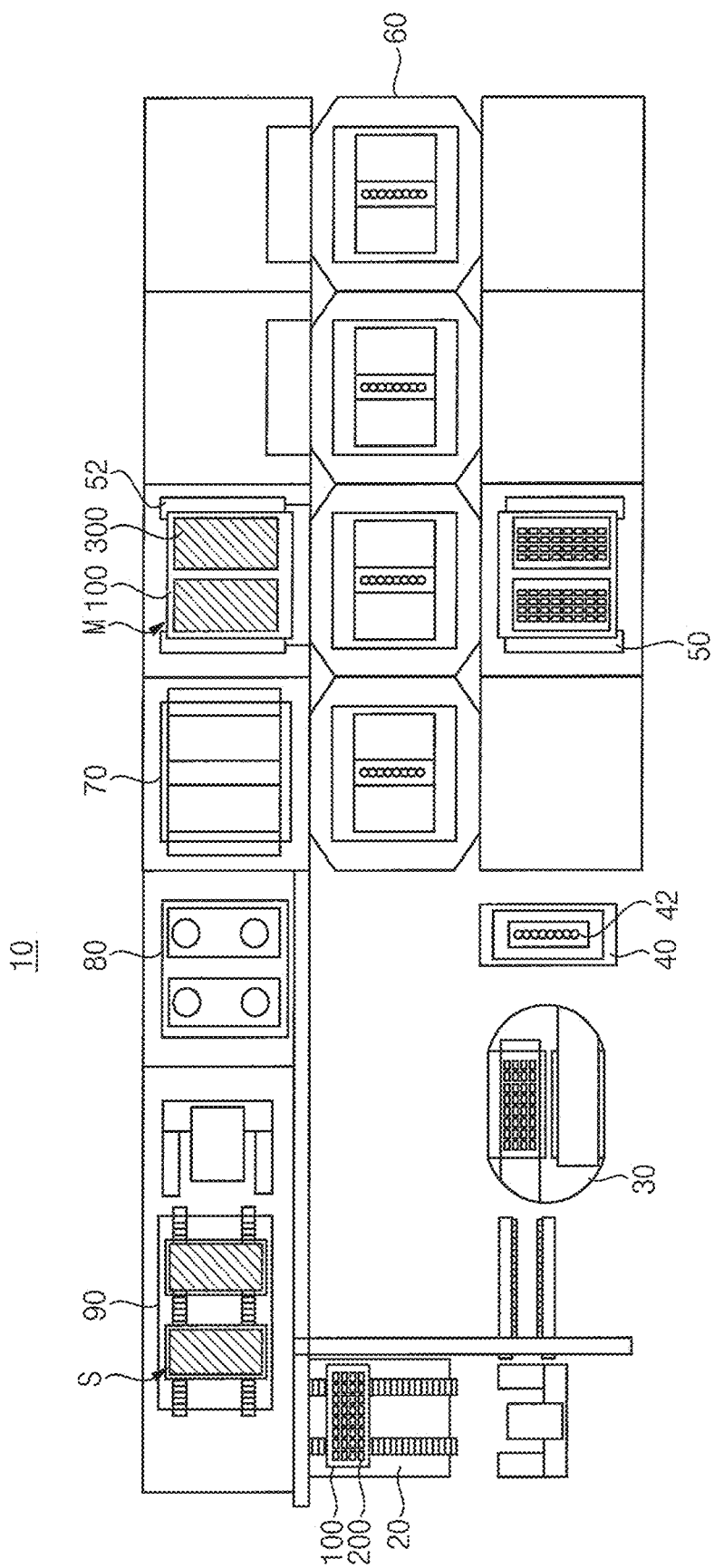
FIGS. 1 to 31 represent some non-limiting, example embodiments as described herein.

FIG. 1 is a block diagram illustrating a molding system for manufacturing a semiconductor package in accordance with an example embodiment.

Referring to FIG. 1, a molding system 10 for a semiconductor package may include a loading unit 20 (e.g., rack), a positioning unit 30 (e.g., robotic apparatus), a sealing material supply unit 40 (e.g., cannister with nozzle for dispensing the sealing material), a first handler 50, a second handler 52, a molding apparatus 60, a de-gating apparatus 70, a collecting unit 80 and an unloading unit 90. The first handler 50 and second handler 52 may be implemented with conveyor equipment. The collecting unit 80 may include a chuck. However, example embodiments are not limited thereto.

In example embodiments, in processes of manufacturing a semiconductor package, a plurality of semiconductor chips 200 individualized from a wafer may be mounted on a strip-shaped substrate 100, and then, the substrate may be loaded into the loading unit 20 of the molding system 10 in order to performing a molding process for protecting the semiconductor chips 200 from the external environment.

The substrates 100 loaded in the loading unit 20 may be transferred to the positioning unit 30, and a substrate shifter of the positioning unit 30 may change orientations of the substrates 100 to desired directions. The first handler 50 may move a pair of substrates 100 from the positioning unit 30 to the molding apparatus 60. For example, four molding apparatuses 60 may be provided, and the first handler 50 may moves the pair of substrates 100 to one molding apparatus 60 among the molding apparatuses 60. At this time, a sealing material 42 in a tablet state from the sealing material supply unit 40 may be supplied onto a plunger 66 (see FIG. 2) of the molding apparatus 60 as will be described later.

A molding member 300 may be formed on the pair of substrates 100 by the molding apparatus 60 to cover the semiconductor chips 200. As will be described later, the molding member 300 may include a sealing portion covering the semiconductor chips 200, a curl portion and a dummy curl portion, gate runner portions may be provided between the sealing portion and the curl portion, and dummy runner portions may be provided between the sealing portion and the dummy portion.

The second handler 52 may move a molded article M for a semiconductor strip including the pair of substrates 100 on which the molding member 300 is formed, to the de-gating apparatus 70. The de-gating apparatus 70 may remove the curl portion and the dummy curl portion from the molded article M for a semiconductor strip by cutting the gate runner portions and the dummy runner portions. Accordingly, a pair of semiconductor strips S may be formed. Here, the removed curl portion and the removed dummy curl portion may be collected in the collecting unit 80.

Then, the semiconductor strips S may be loaded into a magazine through the unloading unit 90 (e.g., rack) along a transfer rail, and then may be transferred to an apparatus for a subsequent package process. The magazine may serve as a carrier for loading a plurality of the strips S therein in order for the semiconductor package manufacturing process.

In example embodiments, a plurality of adhesion reducing pads may be formed in an upper surface of the substrate 100 to be in contact with each of the dummy runner portions of the molding member 300 so as to reduce adhesion with the dummy runner portions. The adhesion reducing pads may limit and/or prevent a sealing material burr from generating in an edge of the semiconductor strip S when the dummy runner portions are removed from the sealing portion.

Accordingly, it may be possible to limit and/or prevent the semiconductor strip from being caught in the transfer rail or the magazine by the burr to cause defects in a subsequent process.

Hereinafter, the molding apparatus in FIG. 1 will be described in detail.

Figure 2:
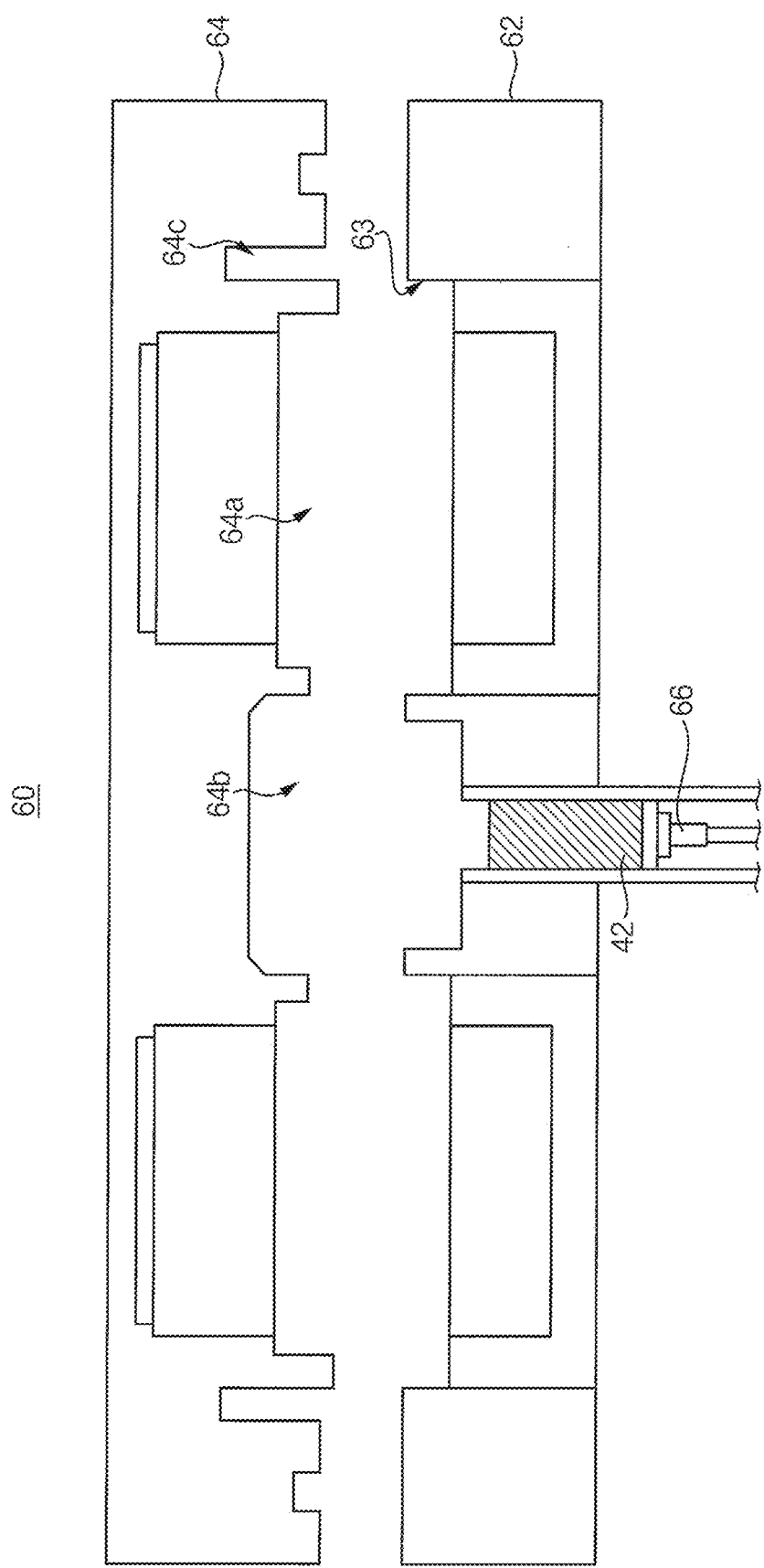
Figure 3:
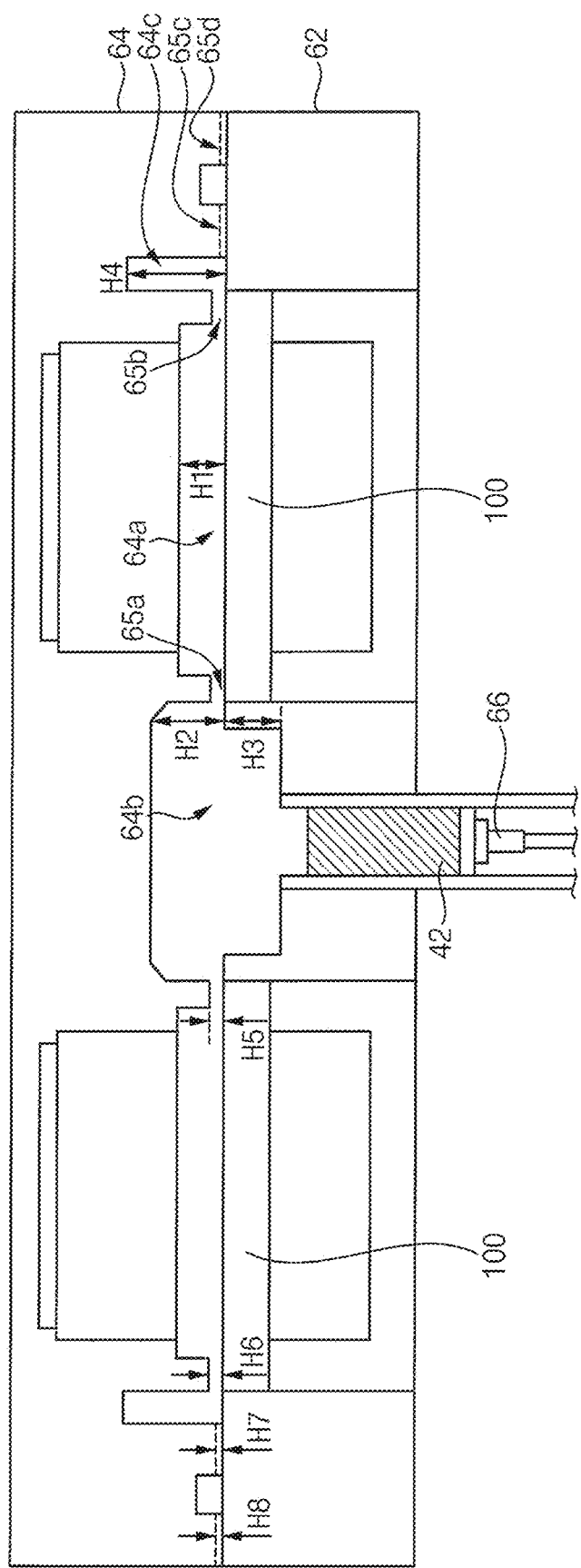
Figure 4:
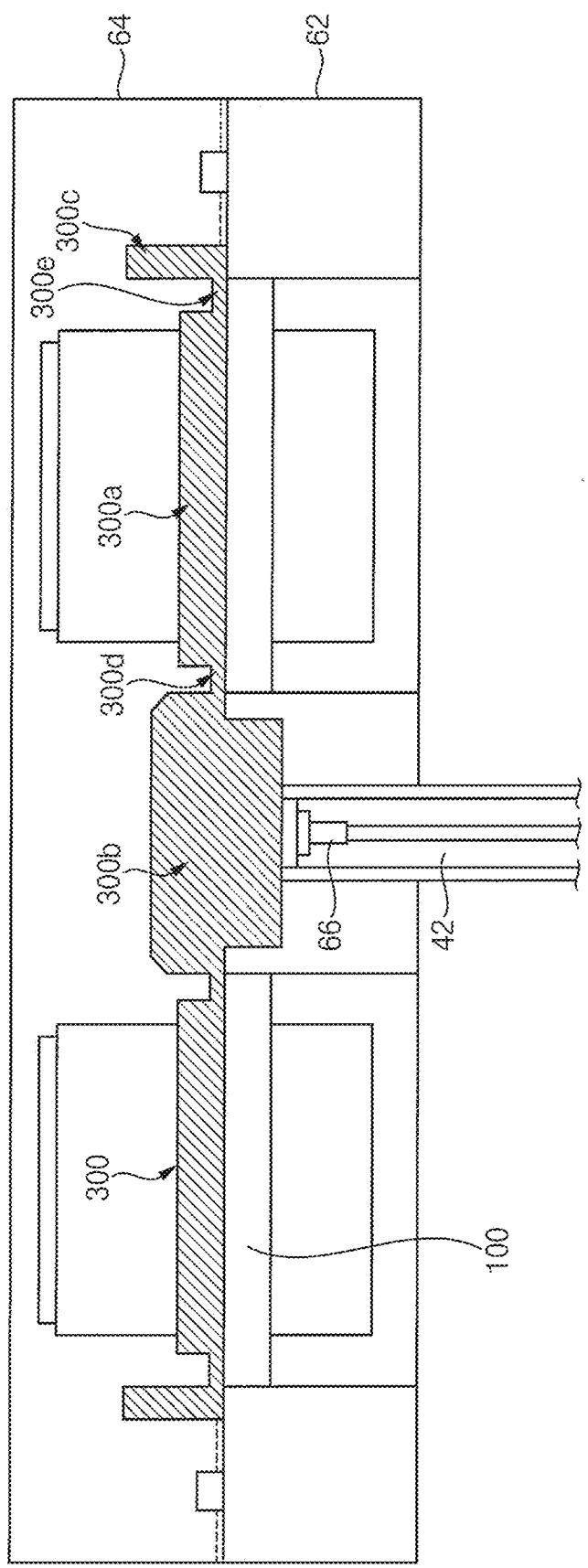
Figure 5:
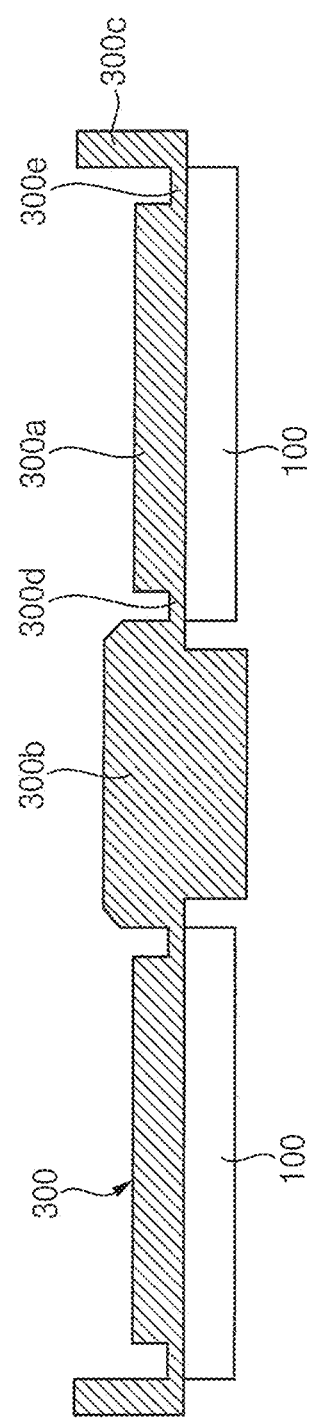

FIG. 2 is a cross-sectional view illustrating a molding apparatus in accordance with an example embodiment. FIGS. 3 and 4 are cross-sectional views illustrating operations of molding a semiconductor chip on a substrate using the molding apparatus of FIG. 2. FIG. 5 is a cross-sectional view illustrating a molded product for semiconductor strip molded by the molding apparatus of FIG. 2.

Referring to FIGS. 2 to 5, a molding apparatus 60 may include a mold having a lower mold 62 and an upper mold 64 that are clamped to each other to form a molding space for molding at least one semiconductor chip. The molding apparatus 60 may be a transformer molding apparatus configured to flow a liquid sealing material into the molding space to mold the semiconductor chip.

For example, the molding apparatus 60 may perform a molded underfill (MUF) process. The semiconductor chip may be disposed in the molding space, and the sealing material may flow under high temperature and high pressure when the lower mold 62 and the upper mold 64 are clamped so that the liquid sealing material flows through the inside of the molding space and then is solidified to form the molding member 300 covering the semiconductor chip. For example, the sealing material may include an epoxy mold compound (EMC).

As illustrated in FIGS. 2 and 3, a recess 63 may be provided in an upper surface of the lower mold 62 to accommodate the substrate 100 on which the semiconductor chip is bonded. For example, about 50 to 800 semiconductor chips may be disposed on the substrate 100. An upper surface of the substrate 100 received in the recess 63 of the lower mold 62 may be coplanar with the upper surface of the lower mold 62.

The molding space within the mold may include a cavity 64a in which the semiconductor chip on the substrate 100 is disposed, a curl 64b with which a sealing material 42 is provided, and a plurality of gate runners 65a as pathways through which the sealing material 42 is introduced into the cavity 64a from the curl 64b. As the sealing material 42 is introduced into the mold, a vent portion may be provided to evacuate a gas within the molding space. For example, the vent portion may include a first vent 65c and a second vent 65d that are sequentially disposed and have different heights.

The molding space within the mold may further include a dummy curl 64c provided between the cavity 64a and the vent portion and a plurality of dummy runners 65b as pathways through which the sealing material 42 inside the cavity 64a is discharged to the dummy curl 64c. The gas of the cavity 64a may be exhausted to the outside through the vent portion, and the dummy curl 64c may be filled up with the sealing material remaining after sufficiently filling up the cavity 64a, to thereby improve a resin filling property inside the cavity 64a.

For example, a height H1 of the cavity 64a may be determined in consideration of a height of the semiconductor chip. The height H1 of the cavity 64a may be smaller than a height H2 of an upper portion of the curl 64b. The height H2 of the upper portion of the curl 64b may be about 1 mm A height H3 of a lower portion of the curl 64b may be about 1 mm A height H4 of the dummy curl 64c may be greater than the height H1 of the cavity 64a and the height H2 of the upper portion of the curl 64b. A height H4 of the dummy curl 64c may be about 1.2 mm A height H5 of the gate runner 65a may be equal to or greater than a height H6 of the dummy runner 65b. The height H5 of the gate runner 65a may be within a range of about 100 μm to about 400 μm, and the height H6 of the dummy runner 65b may be about 100 μm. A height H7 of the first vent 65c may be about 20 μm, and a height H8 of the second vent 65d may be about 20 μm. It will be understood that the dimensions of each component of the molding space are examples, and may be determined in consideration of the area and thickness of the substrate 100, the number of the semiconductor chips, physical properties of the sealing material, etc.

A tablet-type sealing material 42 from a sealing material supply unit 40 (see FIG. 1) may be provided onto a plunger 66 and may be heated to have fluidity. Then, as the plunger 66 rises, the liquid sealing material 42 may flows into the molding space by the pressure of the plunger 66 and then may be solidified to form the molding member 300 on the substrate 100.

As illustrated in FIG. 5, the molded article M for a semiconductor strip may include the molding member 300 formed on the substrate 100. The molding member 300 may include a sealing portion 300a, a curl portion 300b, a dummy curl portion 300c, a plurality of gate runner portions 300d, and a plurality of dummy runner portions 300e.

The sealing portion 300a may be a portion of resin that is solidified in the cavity 64a and covers the plurality of semiconductor chips on the substrate 100. The curl portion 300b may be a portion of resin that is solidified in the curl 64b and is provided outside a first side portion of the substrate 100. The dummy curl portion 300c may be a portion of resin that is solidified in the dummy curl 64c and is provided outside a second side portion opposite to the first side portion of the substrate 100. The gate runner portions 300d may be portions of resin that is solidified in the plurality of gate runners 65a respectively, and the dummy runner portions 300e may be portions of resin solidified in the plurality of dummy runners 65b respectively.

In example embodiments, the substrate 100 may include first and second cutting regions respectively provided along the first and second side portions, and a mounting region between the first and second cutting regions. The sealing portion 300a may be provided in the mounting region of the substrate 100, and the gate runner portions 300d may be arranged in the first cutting region to be spaced apart from each other along an extending direction of the first side portion, and the dummy runner portions 300e may be arranged in the second cutting region to be spaced apart from each other along an extending direction of the second side portion.

The substrate 100 may include a plurality of adhesion reducing pads 130 (see FIG. 15) disposed along the second side portion in the second cutting region and provided to be in contact with the dummy runner portions 300e respectively. The adhesive force reducing pads may limit and/or prevent a burr from generating to protrude outwardly from the second side portion of the substrate 100 when a de-gating apparatus 70 cuts the dummy runner portions 300e.

Hereinafter, the de-gating apparatus in FIG. 1 will be described in detail.

Figure 6:
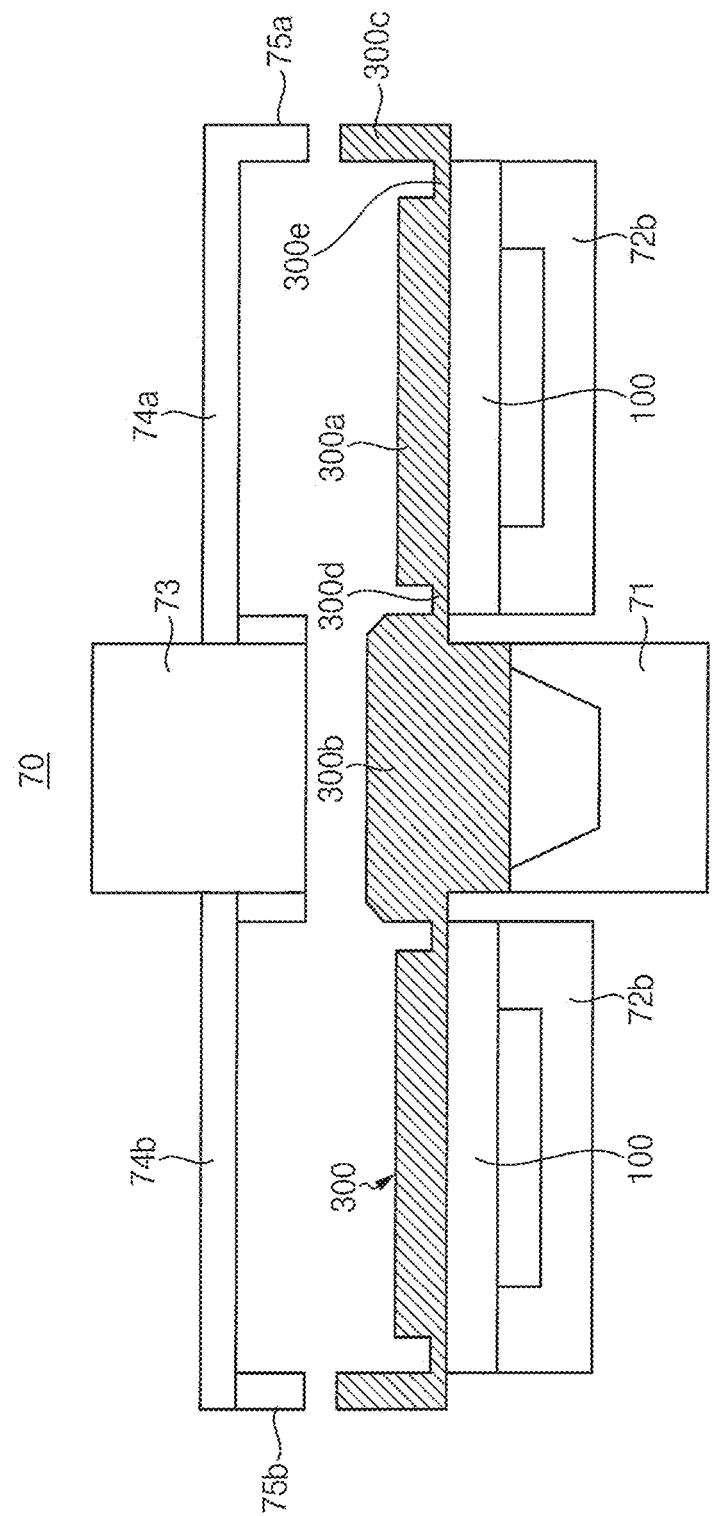
Figure 7:
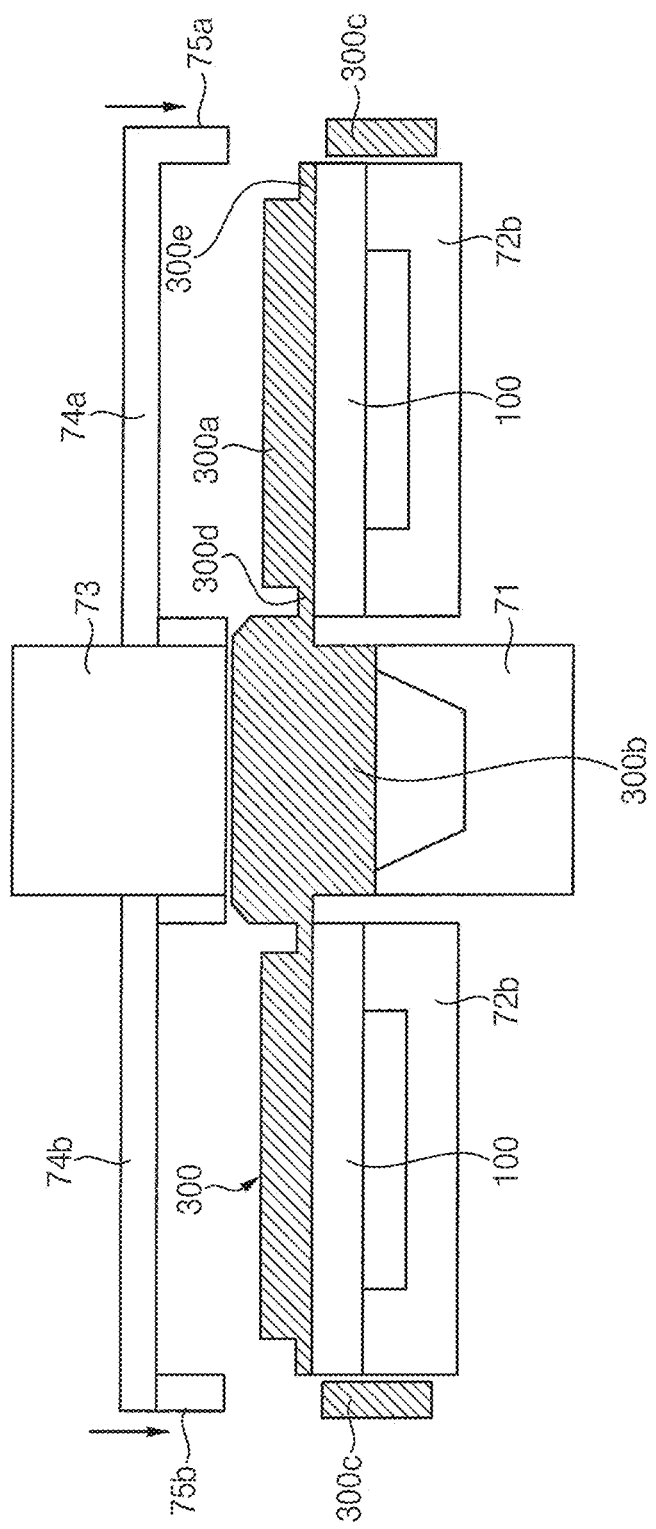
Figure 8:
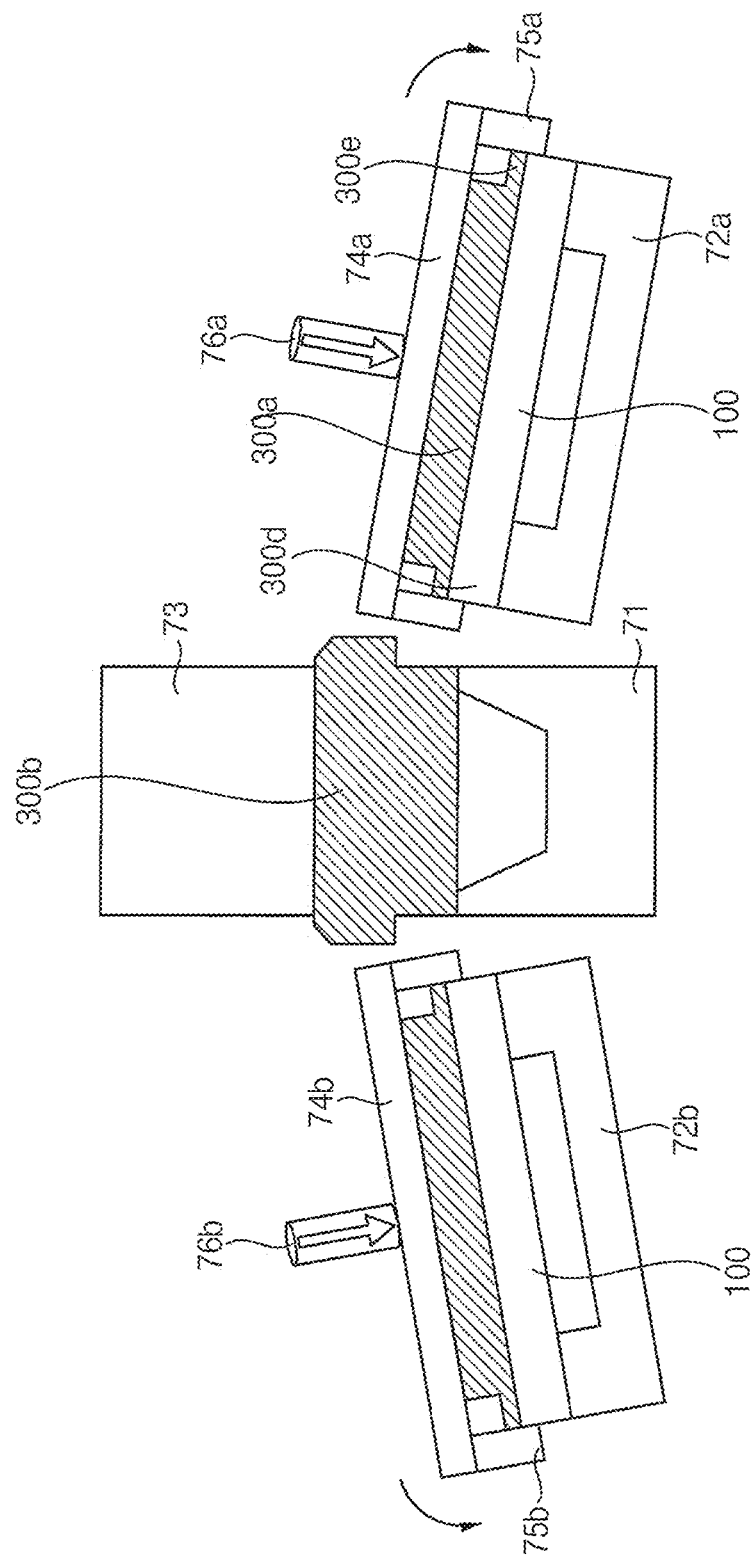

FIG. 6 is a cross-sectional view illustrating a de-gating apparatus in accordance with an example embodiment. FIGS. 7 and 8 are cross-sectional views illustrating operations of removing a curl portion and a dummy curl portion remaining in the molding member using the de-gating apparatus of FIG. 6.

Referring to FIGS. 6 to 8, a de-gating apparatus 70 may include a curl portion support 71 configured to support the curl portion 300b of the molded article M for a semiconductor strip formed by the molding apparatus 60 and a substrate support 72a, 72b configured to supporting the substrate 100. The de-gating apparatus may include a first pressing part 73 configured to press the curl portion 300b, a second pressing part 74a, 74b configured to pressing the sealing portion, and a third pressing part 75a, 75b configured to press the dummy curl portion 300c.

As illustrated in FIG. 6, the substrate 100 on which the molding member 300 is formed may be supported on the substrate support 72a, 72b of the de-gating apparatus 70. At this time, the curl portion 300b may be supported on the curl portion support 71.

Then, as illustrated in FIG. 7, after the first to third pressing parts descend at the same time, the third pressing part 75a, 75b may press the dummy curl portion 300c downward and cut the dummy runner portions 300e having a relatively thin thickness. As the dummy runner portions 300e are cut, the dummy curl portion 300c may be removed from the molding member 300.

Then, as illustrated in FIG. 8, the first to third pressing parts may further descend such that the first pressing part 73 presses an upper surface of the curl portion 300b and the second pressing part 74a, 74b presses an upper surface of the sealing portion 300a. Accordingly, the curl portion 300b may be sandwiched by the first pressing part 73 and the curl portion support 71, and the sealing portion 300a may be sandwiched by the second pressing part 74a, 74 and the substrate support 72a, 72b.

Next, in the state in which the curl portion 300b is fixed, a rotation pressing part 76a, 76b may press the second pressing part 74a, 74b downward to rotate the sealing portion 300a with respect to the curl portion 300b, so that the gate runner portions 300d having a relatively thin thickness is cut. As the gate runner portions 300d are cut, the curl portion 300b may be removed from the molding member 300.

Thus, a pair of semiconductor strips S from which the curl portion 300b and the dummy curl portion 300c are removed may be obtained. The semiconductor strips S may be loaded into a magazine from an unloading unit 90 through the transfer rail, and then may be transferred to an apparatus for a subsequent package process.

Hereinafter, a method of manufacturing a molded product for semiconductor strip and a semiconductor package using the molding system for a semiconductor package will be described.

Figure 9:
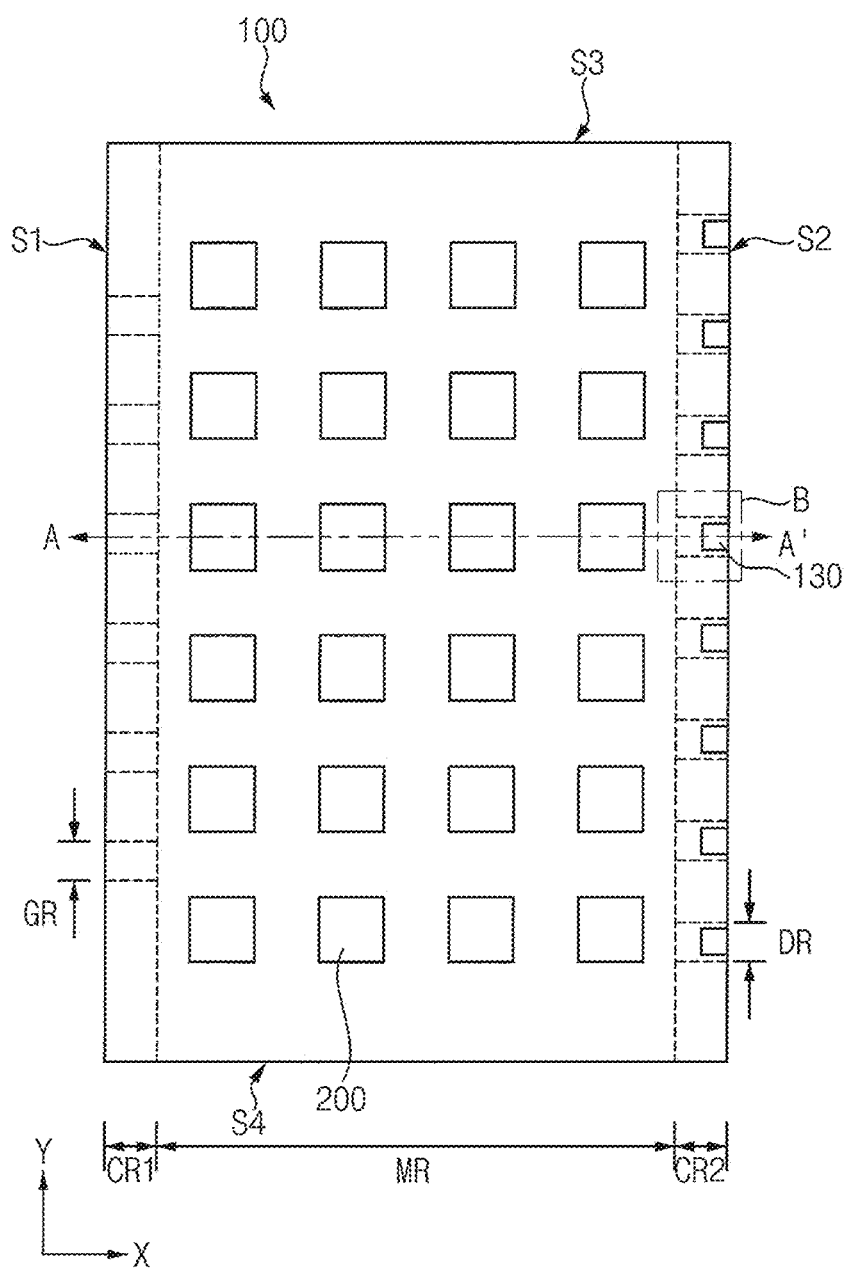
Figure 10:
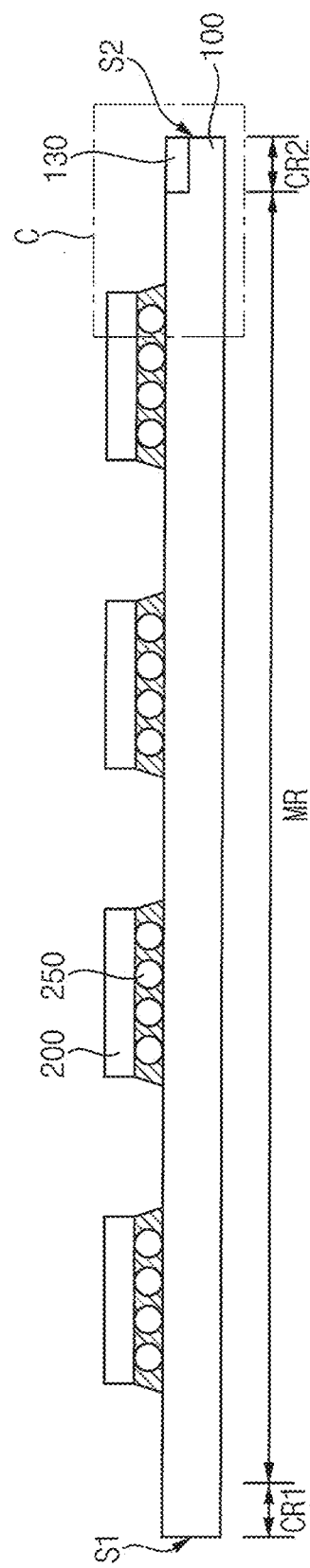
Figure 11:
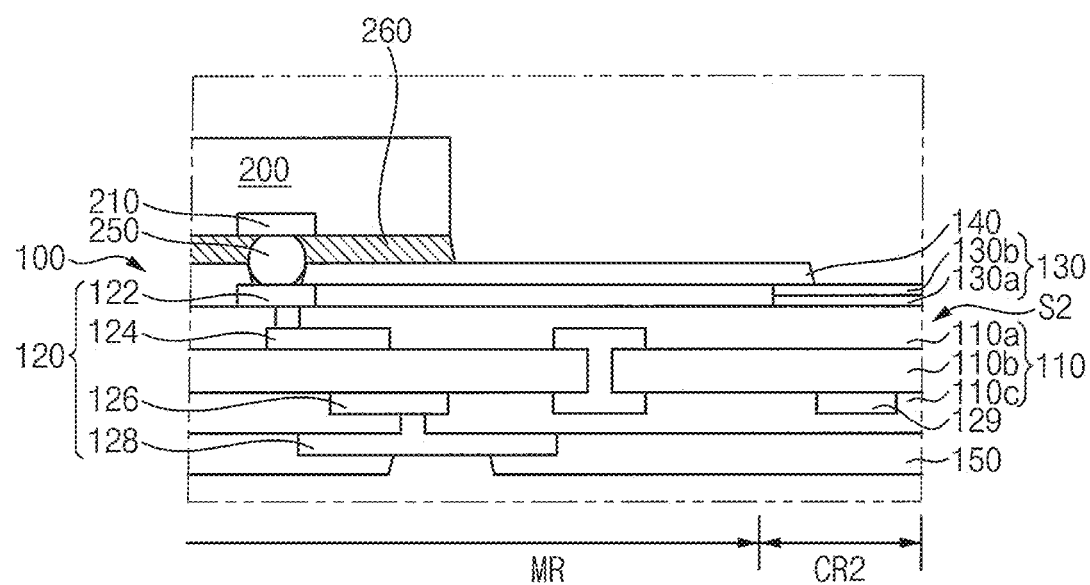
Figure 12:
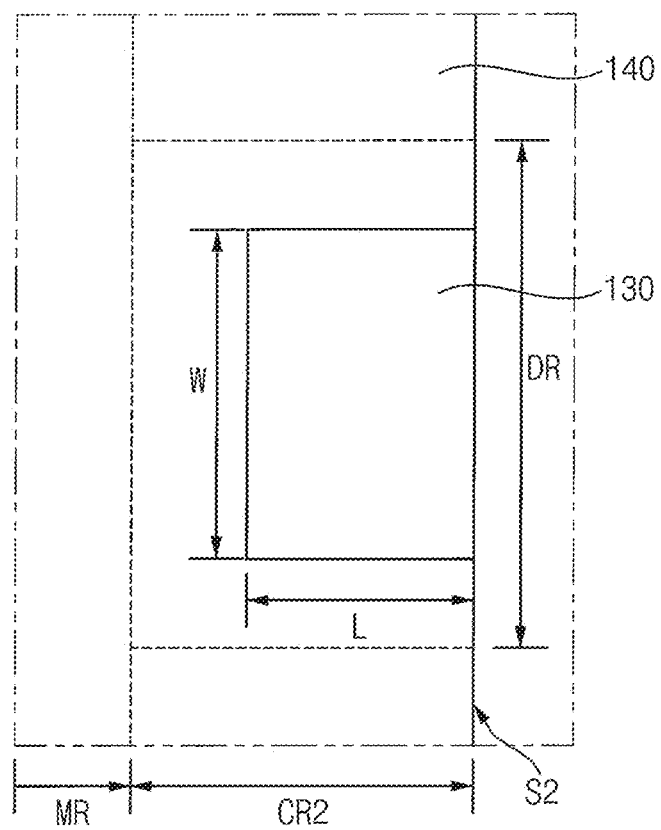
Figure 13:
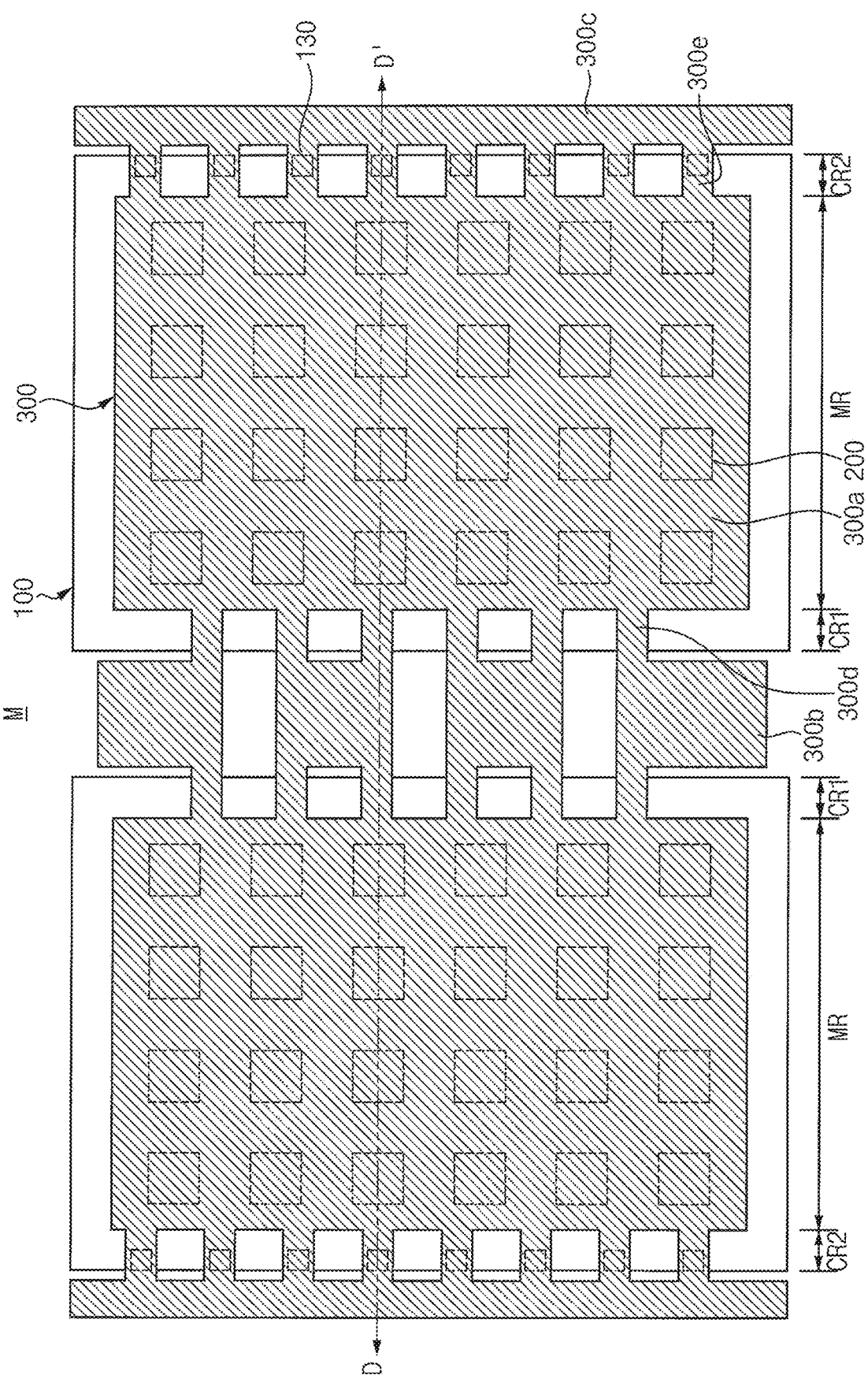
Figure 14:
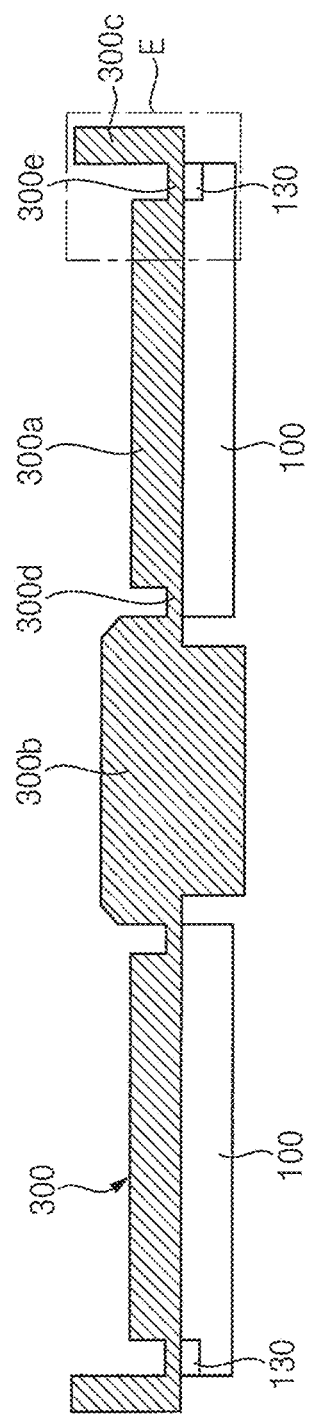
Figure 15:
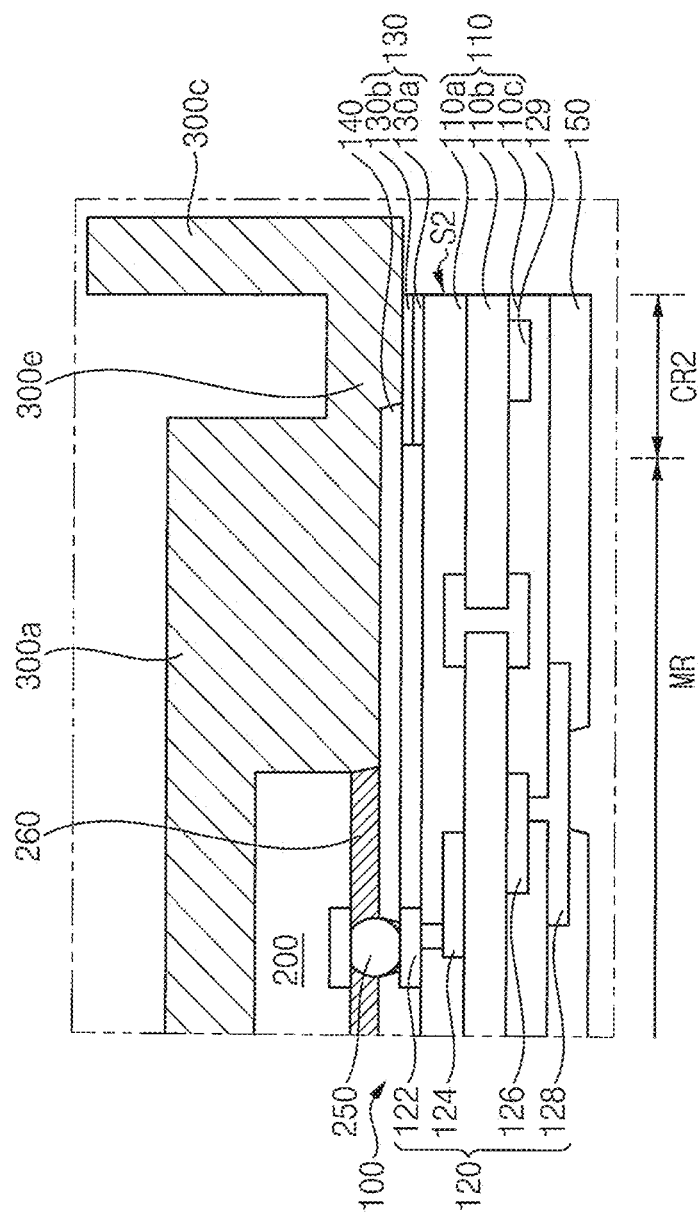
Figure 16:
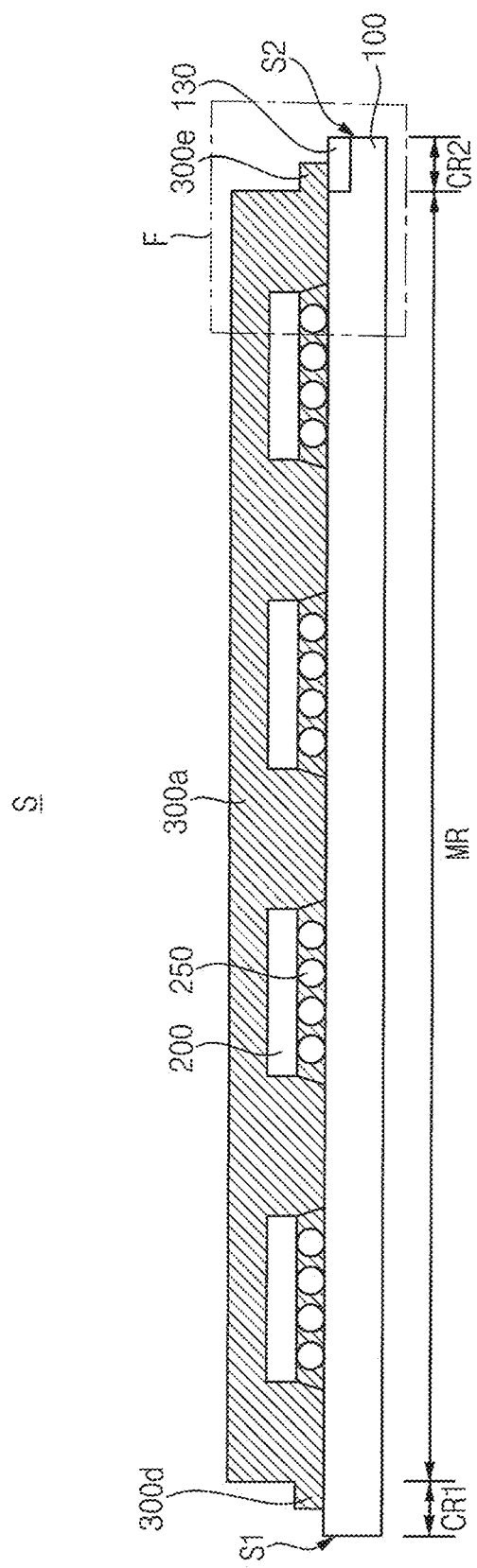
Figure 17:
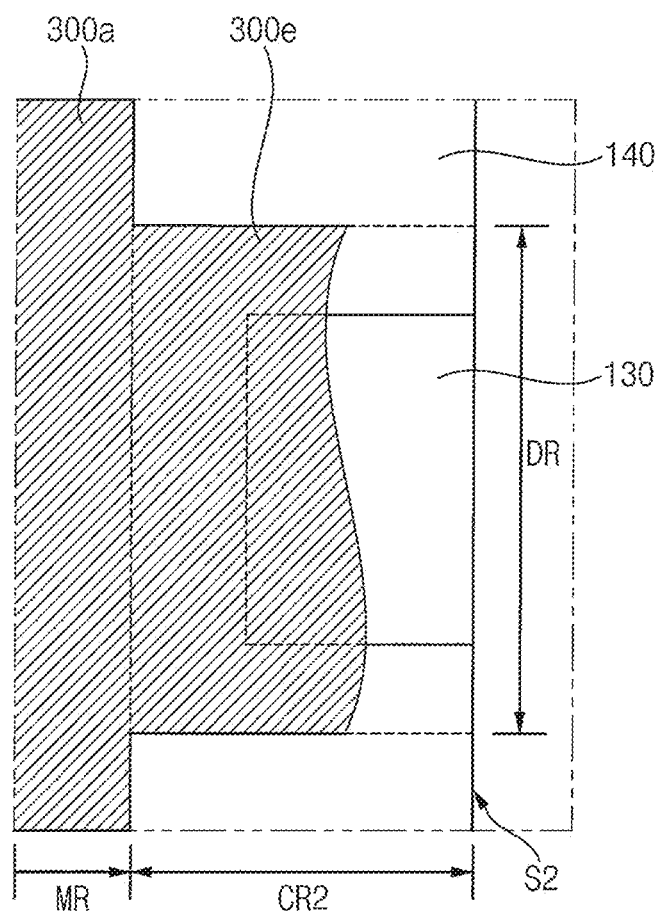
Figure 18:
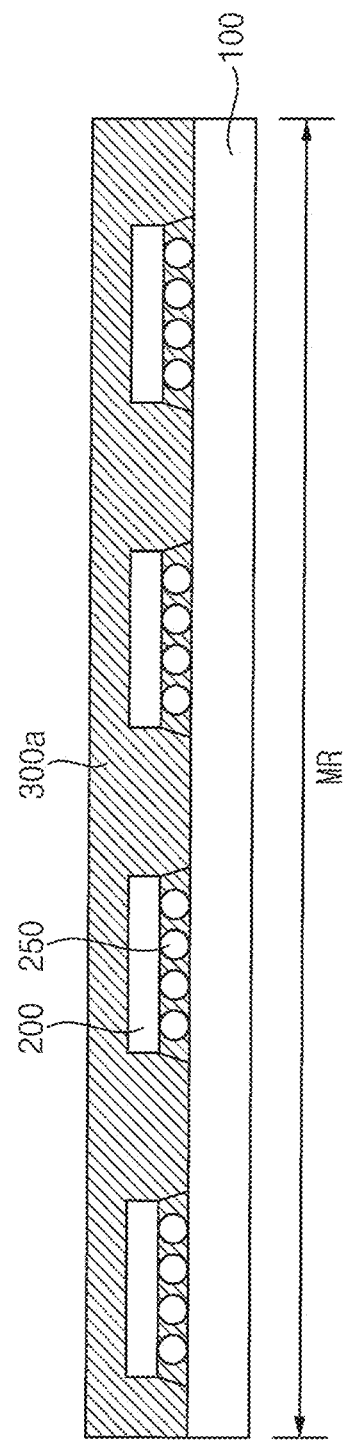

FIGS. 9 to 19 are views illustrating a method of manufacturing a semiconductor package in accordance with an example embodiment. FIG. 9 is a plan view illustrating a strip substrate on which semiconductor chips are mounted. FIG. 10 is a cross-sectional view taken along the line A-A' in FIG. 9. FIG. 11 is an enlarged cross-sectional view illustrating a portion C in FIG. 10. FIG. 12 is an enlarged plan view illustrating a portion B in FIG. 9. FIG. 13 is a plan view illustrating a molded product for semiconductor strip including a molding member formed on the strip substrate of FIG. 9. FIG. 14 is a cross-sectional view taken along the line D-D' in FIG. 13. FIG. 15 is an enlarged cross-sectional view illustrating a portion E in FIG. 14. FIG. 16 is a cross-sectional view illustrating a semiconductor strip including a molding member from which a curl portion and a dummy curl portion are removed in FIG. 14. FIG. 17 is an enlarged plan view illustrating a portion F in FIG. 16. FIG. 18 is a cross-sectional view illustrating a semiconductor strip from which first and second cutting regions in FIG. 16 are removed.

Referring to FIGS. 9 to 12, first, a substrate 100 including a plurality of adhesion reducing pads 130 may be provided, and at least one semiconductor chip 200 may be mounted on the substrate 100.

In example embodiments, in order to manufacture a semiconductor package, a plurality of semiconductor chips 200 individualized from a wafer may be mounted on the substrate 100 and a molding process may be performed to protect the semiconductor chips 200 from an external environment. For example, the substrate 100 may be a multilayer circuit board as a package substrate having an upper surface and a lower surface facing each other. The substrate 100 may be a strip substrate for manufacturing a semiconductor strip, such as a printed circuit board (PCB).

In particular, the substrate 100 may include a first side portion 51 and a second side portion S2 extending in a direction parallel with a second direction (Y direction) parallel with the upper surface and facing each other, and a third side portion S3 and a fourth side portion S4 extending in a direction parallel with a first direction (X direction) perpendicular to the second direction and facing each other. The substrate 100 may have a rectangular shape when viewed from a plan view. The substrate 100 may have a desired and/or alternatively predetermined area (e.g., 77.5 mm×240 mm).

The substrate 100 may include first and second cut regions CR1 and CR2 respectively provided along the first and second side portions 51 and S2 and a mounting region MR provided between the first and second cutting regions CR1 and CR2. A plurality of the semiconductor chips 200 may be disposed on the mounting region MR of the substrate 100. For example, 50 to 800 semiconductor chips 200 may be arranged on the substrate 100 in a matrix form.

The substrate 100 may further include plurality of gate runner regions GR arranged in the first cutting region CR1 to be spaced apart from each other along the second direction (Y direction) and a plurality of dummy runner regions DR arranged in the second cutting region CR2 to be spaced apart from each other along the second direction. As will be described later, a plurality of gate runner portions 300d and a plurality of dummy runner portions 300e of a molding member 300 may be formed on the gate runner regions GR and the dummy runner regions DR of the substrate 100 respectively by a molding apparatus 60.

Referring to FIG. 11, the substrate 100 may include a plurality of stacked insulating layers 110 and wirings 122, 124, 126 and 128 respectively provided in the insulating layers. The substrate 100 may include first to third insulating layers 110a, 110b and 110c sequentially stacked on one another. The first insulating layer 110a may be an upper insulating layer, the second insulating layer 110b may be a core layer, and the third insulating layer 110c may be a lower insulating layer.

The first wiring 122 may be formed on an upper surface of the first insulating layer 110a, and the second wiring 124 may be formed on an upper surface of the second insulating layer 110b. The third wiring 126 may be formed on a lower surface of the second insulating layer 110b, and the fourth wiring 128 may be formed on a lower surface of the third insulating layer 110c. The first to fourth wirings 122, 124, 126 and 128 may be first to fourth circuit layers stacked in a thickness direction from the upper surface of the substrate 100. For example, the wiring may include a metal material such as copper or aluminum. It may be understood that the arrangement and number of the insulating layers and conductive patterns are an example and not limited thereto.

The substrate 100 may further include a first passivation layer pattern 140 as an upper cover insulating layer and a second passivation layer pattern 150 as a lower cover insulating layer. The first passivation layer pattern 140 may be formed on the upper surface of the first insulating layer 110a to expose portions of the first wirings 122. The portions of the first wirings 122 exposed by the first passivation layer pattern 140 may serve as substrate pads. The second passivation layer pattern 150 may be formed on the lower surface of the third insulating layer 110c to expose portions of the fourth wirings 128. The portions of the fourth wirings 128 exposed by the second passivation layer pattern 150 may serve as external connection pads. For example, the first and second passivation layer patterns 140 and 150 may include an insulating material such as solder resist to perform a passivation function.

In example embodiments, the substrate 100 includes a plurality of the adhesion reducing pads 130 disposed in the second direction (Y direction) along the second side portion S2 in the second cut region CR2. The adhesion reducing pads 130 may be disposed in the plurality of dummy runner regions DR, respectively. At least a portion of the adhesion reducing pad 130 may be exposed by the first passivation layer pattern 140. As will be described later, the dummy runner portions 300e may be formed to come into contact with the adhesion reducing pads 130 respectively by the molding apparatus 60.

The adhesion reducing pad 130 may be formed by a process the same as or different from a process of forming the first wiring 122. For example, a thickness of the adhesion reducing pad may be within a range of about 2 μm to about 10 μm. The adhesion reducing pad 130 may include at least two metal layers 130a and 130b. The first metal layer 130a may include nickel (Ni) and the second metal layer 130b may include gold (Au). For example, a thickness of the first metal layer 130a may be within a range of about 2 μm to about 8 μm, and a thickness of the second metal layer 130b may be within a range of about 0.3 μm to about 0.7 μm.

Referring to 12, the adhesion reducing pad 130 may be formed to at least partially cover the corresponding dummy runner region DR. Alternatively, the adhesion reducing pad 130 may be formed to cover the entire dummy runner region DR. A length L of the adhesion reducing pad 130 may be in a range of about 0.5 mm to about 1.5 mm A width W of the adhesion reducing pad 130 may be within a range of about 1 mm to about 3 mm. An outer surface of the adhesion reducing pad 130 may be located on the same plane as an outer surface of the second side portion S2 of the substrate 100.

The substrate 100 may further include a dummy wiring 129 provided in the insulating layer in the second cutting region CR2. For example, the dummy wiring 129 may be formed on the lower surface of the second insulating layer 110b. Alternatively, the dummy wiring 129 may be formed on the upper surface of the second insulating layer 110b or the lower surface of the third insulating layer 110c.

The dummy wiring 129 may be formed by the same process as the wiring. For example, the dummy wiring 129 may include a metal material such as copper or aluminum. The dummy wire 129 may not be electrically connected to a connection member 250. The dummy wiring 129 may be provided in the insulating layer in the second cut region CR2 to limit and/or prevent warpage at an edge region of the substrate 100.

In example embodiments, the semiconductor chips 200 may be mounted on the substrate 100 by a flip chip bonding method. In this case, the semiconductor chip 200 may be mounted on the substrate 100 such that an active surface on which chip pads 210 are formed faces the substrate 100.

The semiconductor chip 200 may be mounted on the substrate 100 through the connection member 250. For example, the connection member 250 may include a conductive bump. The conductive bump may include a conductive pillar as a lower bump and solder as an upper bump. The conductive pillar may include a copper pillar. The solder may include tin (Sn), tin/silver (Sn/Ag), tin/copper (Sn/Cu), tin/indium (Sn/In), tin/silver/copper (Sn/Ag/Cu), etc. Accordingly, the semiconductor chip 200 may be electrically connected to the substrate 100 by the connection member 250.

An underfill member 260 may be formed between the active surface of the semiconductor chip 200 and the upper surface of the substrate 100. The underfill member 260 may be formed by a capillary underfill process.

Referring to FIGS. 13 to 15, the molding member 300 covering the semiconductor chips 200 may be formed on the substrate 100.

In example embodiments, the molding member 300 may be formed on the substrate 100 by the transformer molding apparatus 60. The substrate 100 may be disposed in a molding space of a mold of the molding apparatus 60 of FIG. 2, and a sealing material may flow under high temperature and high pressure while a lower mold 62 and an upper mold 64 are clamped each other to produce the liquid sealing material. After flowing through the molding space, the liquid sealing material may be solidified to form the molding member 300 covering the semiconductor chips 200. For example, the sealing material may include an epoxy mold compound (EMC).

A molded article M for a semiconductor strip may include the molding member 300 formed on the substrate 100. The molding member 300 may include a sealing portion 300a, a curl portion 300b, a dummy curl portion 300c, a plurality of gate runner portions 300d and a plurality of dummy runner portions 300e.

The sealing portion 300a may be a portion of resin that is solidified in a cavity 64a of the molding space and covers the plurality of semiconductor chips on the substrate 100 in the mounting region MR. The curl portion 300b may be a portion of resin that is solidified in a curl 64b and is provided outside the first side portion 51 of the substrate 100. The dummy curl portion 300c may be a portion of resin that is solidified in a dummy curl 64c and is provided outside the second side portion S2 of the substrate 100. The gate runner portions 300d may be portions of resin that is solidified in a plurality of gate runners 65a respectively, and the dummy runner portions 300e may be portions of resin solidified in a plurality of dummy runners 65b respectively.

In some example embodiments, the gate runner portions 300d may be formed on the gate runner regions GR to be contact with the first passivation layer pattern 140 respectively. The dummy runner portions 300e may be formed on the dummy runner regions DR to be contact with the adhesion reducing pads 130 respectively. The adhesive force between the dummy runner portion (EMC) 300e and the adhesion reducing pad (Au/Ni) 130 may be much smaller than the adhesive force between the gate runner portion (EMC) 300d and the first passivation layer pattern (solder resist) 130.

Referring to FIGS. 16 and 17, the curl portion 300b and the dummy curl portion 300c of the molding member 300 may be removed.

In some example embodiments, the curl portion 300b and the dummy curl portion 300c may be removed by the de-gating device 70 of FIG. 7. After the substrate 100 on which the molding member 300 is formed is supported on a substrate support 72a, 72b of the de-gating device 70, a third pressing part 75a, 75b press the dummy curl portion 300c downward to cut the dummy runner portions 300e having a relatively thin thickness. As the dummy runner portions 300e are cut, the dummy curl portion 300c may be removed from the molding member 300. That is, at least portions of the dummy curl portions 300c and the dummy runner portions 300e may be removed together. When the dummy curl portion 300c is removed, the at least portions of the dummy runner portions 300e are removed together, and remaining portions of the dummy runner portions 300e may remain in the second cutting region CR2 of the substrate 100.

Then, the curl portion 300b may be sandwiched by a first pressing part 73 and a curl portion support 71, and the sealing portion 300a may be sandwiched by a second pressing parts 74a, 74b and the substrate support 72a, 72b. In the state in which the curl portion 300b is sandwiched, a rotation pressing part 76a, 76b may press the second pressing part 74a, 74b downward to rotate and move the sealing portion 300a with respect to the curl portion 300b, so that the gate runner portions 300d having a relatively thin thickness are cut. As the gate runner portion 300d are cut, the curl portion 300b may be removed from the molding member 300. That is, the curl portion 300b and at least portions of the gate runner portions 300d may be removed together. When the curl portion 300b is removed, the at least portions of the gate runner portions 300d are removed together, and remaining portions of the gate runner portions 300d may remain in the first cutting region CR1 of the substrate 100.

Thus, a pair of semiconductor strips S from which the curl portion 300b and the dummy curl portion 300c are removed may be obtained.

As illustrated in FIG. 16, the portion of the dummy runner portion 300e remaining after being cut may not protrude outward from the second side portion S2 of the substrate 100, but may be positioned inward from the second side portion S2. Since the adhesive force between the dummy runner portion 300e and the adhesion reducing pad 130 is relatively small, the dummy runner portion 300e on the adhesion reducing pad 130 may be easily peeled off to limit and/or prevent a bur from occurring to protrude outward from the second side portion S2 of the substrate 100.

Figure 19:
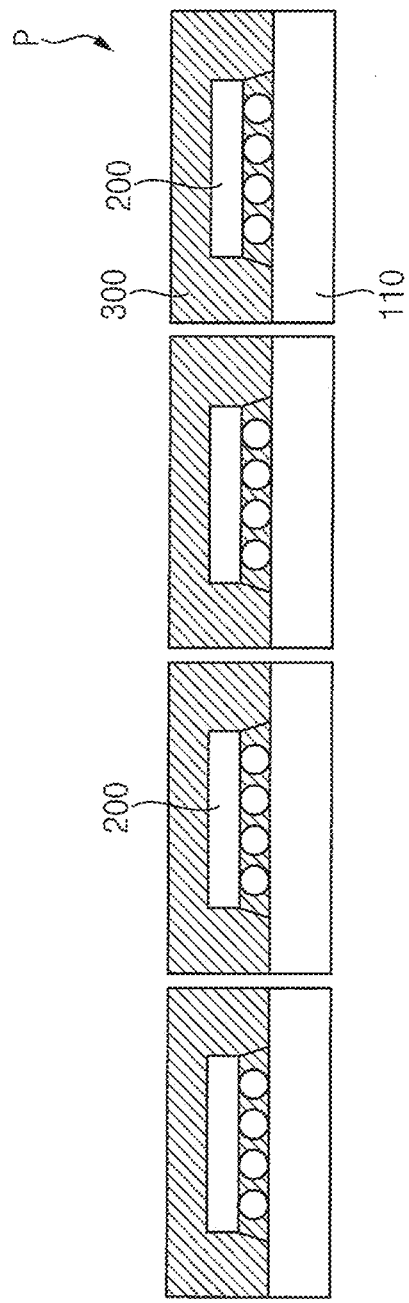

Referring to FIGS. 18 and 19, the semiconductor strip S may be cut by a sawing process to complete semiconductor packages P.

In example embodiments, external connection members such as solder balls may be formed on the external connection pads on the lower surface of the substrate 100, that is, the portions of the fourth wiring 120d exposed by the second passivation layer pattern 150. The first and second cutting regions CR1 and CR2 of the substrate 100 may be removed using a cutting device such as a blade. Then, the mounting region MR of the substrate 100 may be cut by the sawing process into the individual semiconductor packages P.

Figure 20:
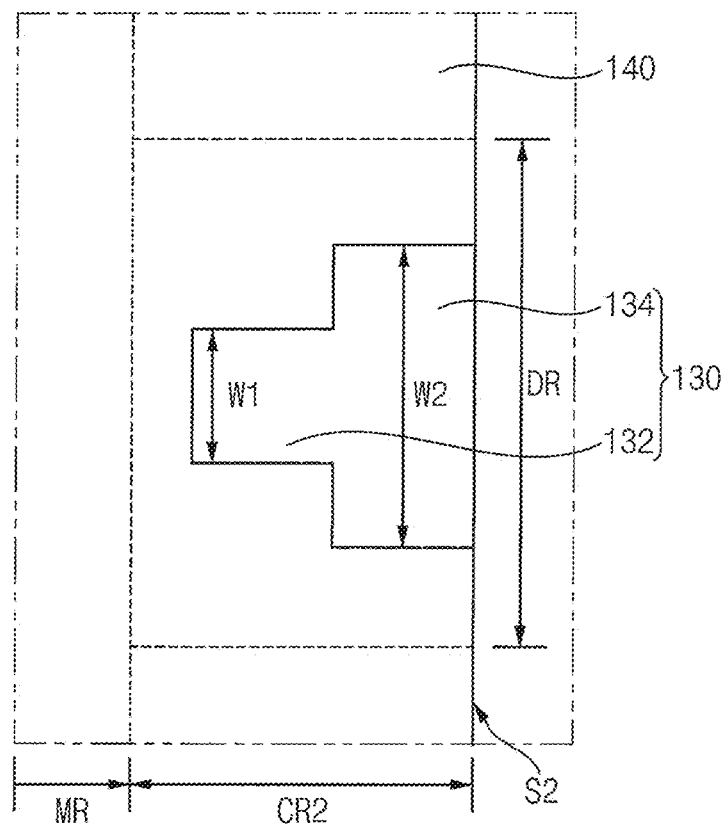
Figure 21:
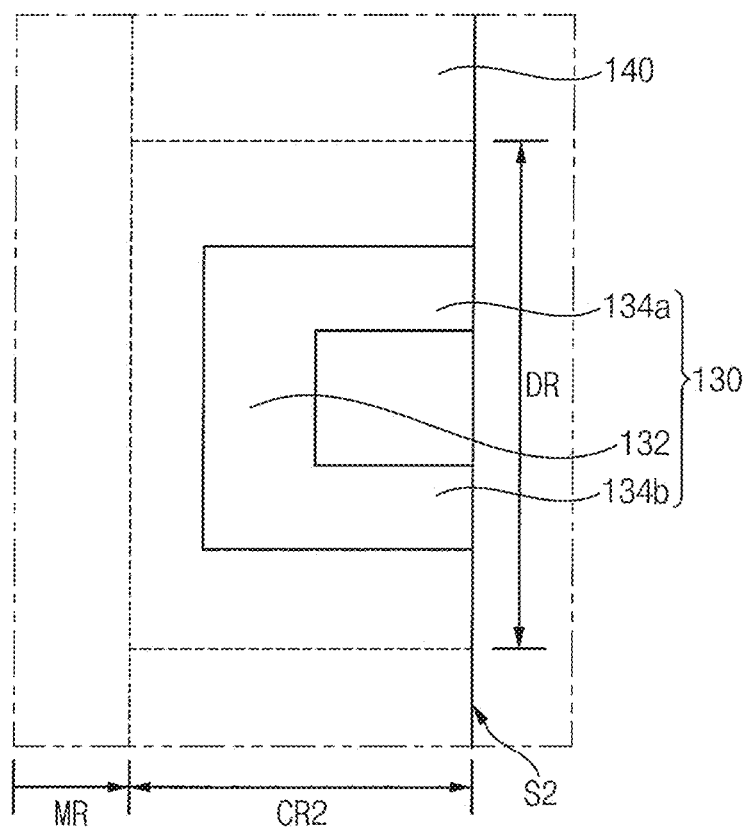

FIGS. 20 and 21 are plan views illustrating an adhesion reducing pad in accordance with an example embodiment.

Referring to FIG. 20, an adhesion reducing pad 130 may be formed to at least partially cover a corresponding dummy runner region DR. The adhesion reducing pad 130 may include a first pad portion 132 and a second pad portion 134. The first pad portion 132 may be disposed in a central region of the second cut region CR2, and the second pad portion 134 may extend from the first pad part 134 toward the second side portion S2. The first pad portion 132 may have a first width W1, and the second pad portion 134 may have a second width W2.

The second pad portion 134 having the second width W2 may have a smaller adhesive force to the dummy runner portion 300e than the first pad portion 132 having the first width W1. Accordingly, the dummy runner portion 300e adjacent to the second side portion S2 may be easily peeled off from the adhesion reducing pad 130.

Referring to FIG. 21, an adhesion reducing pad 130 may include a first pad portion 132 and two second pad portions 134a and 134b extending from the first pad part 132 toward the second side part S2. The first pad portion 132 may have a width greater than that of the second pad portion 134a. A first passivation layer pattern 140 may be exposed between the two second pad parts 134a and 134b.

As described above, a portion of the dummy runner portion 300e that is peeled off from the adhesion reducing pad 130 when the dummy runner portion 300e is cut may be adjusted by changing the shape and arrangement of the adhesion reducing pad 130.

Figure 22:
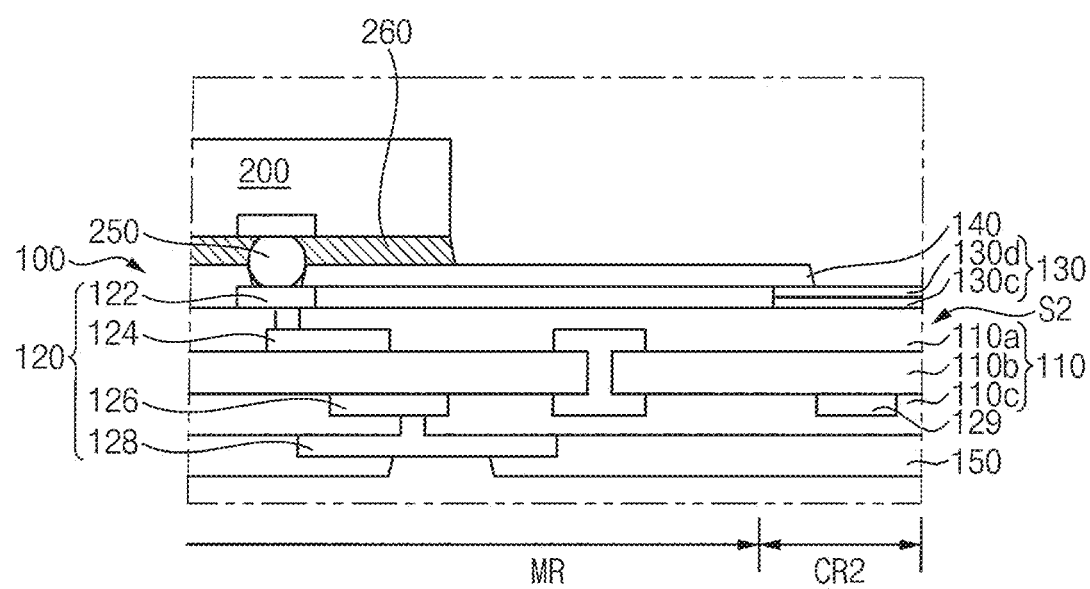
Figure 23:
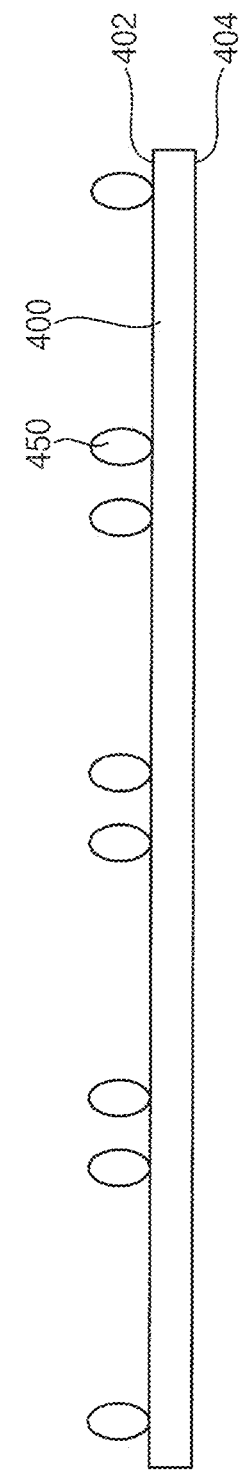
Figure 24:
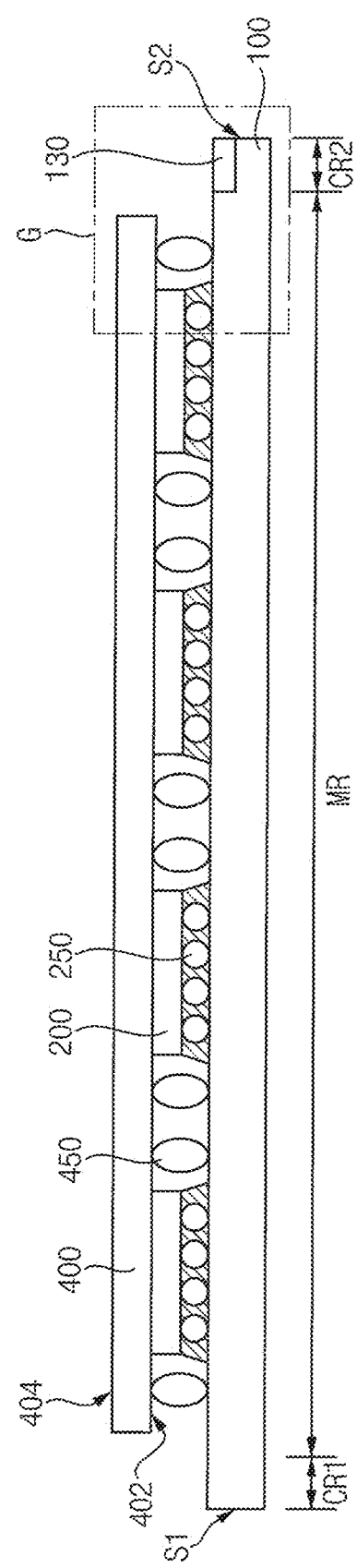
Figure 25:
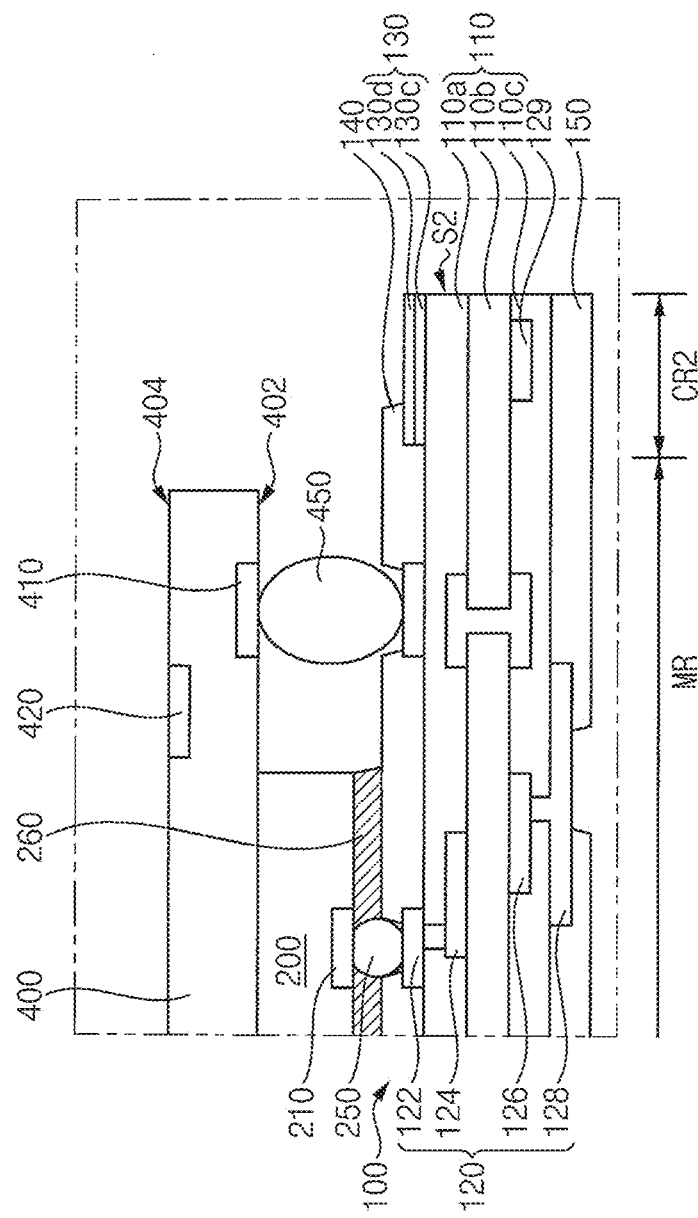
Figure 26:
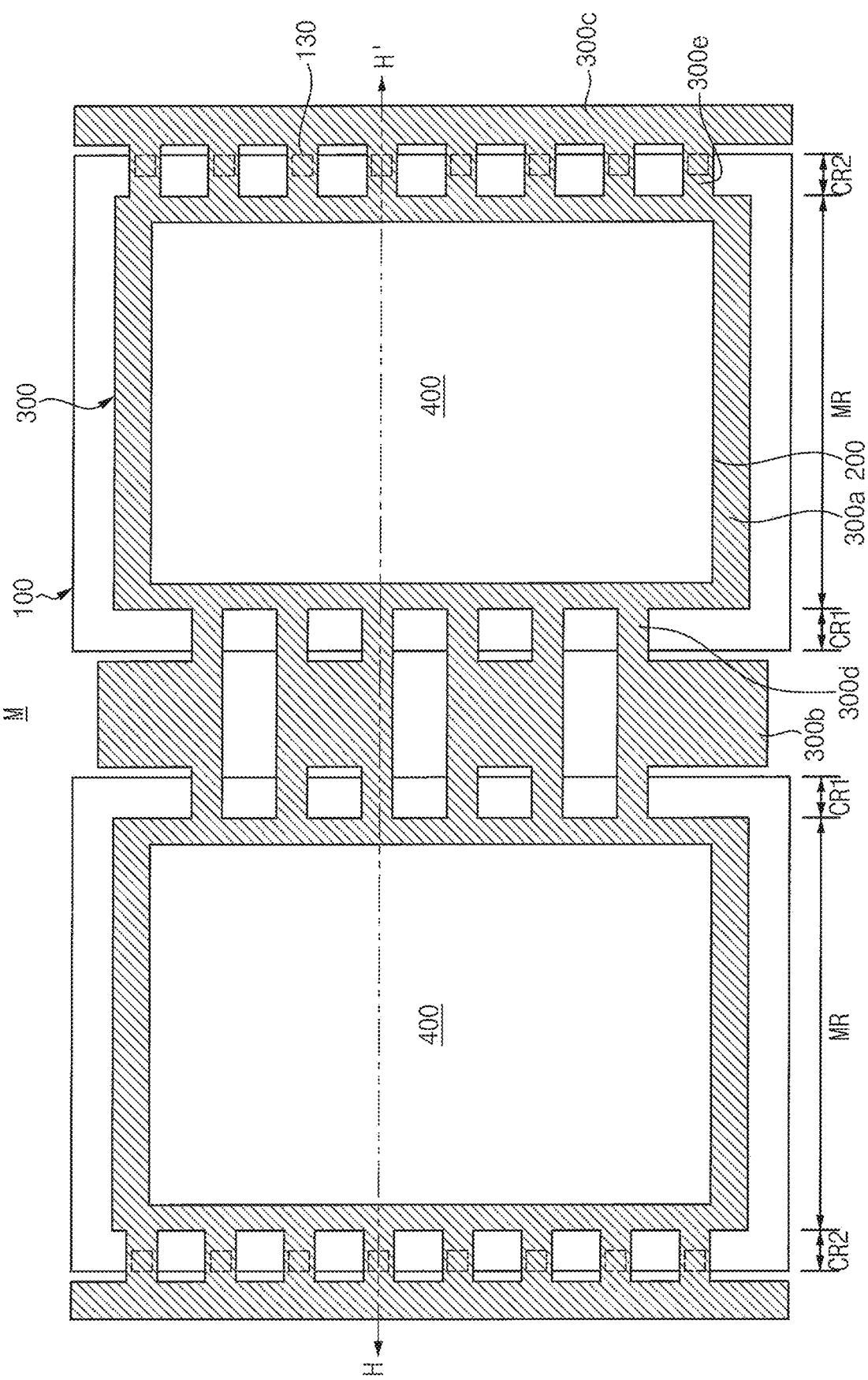
Figure 27:
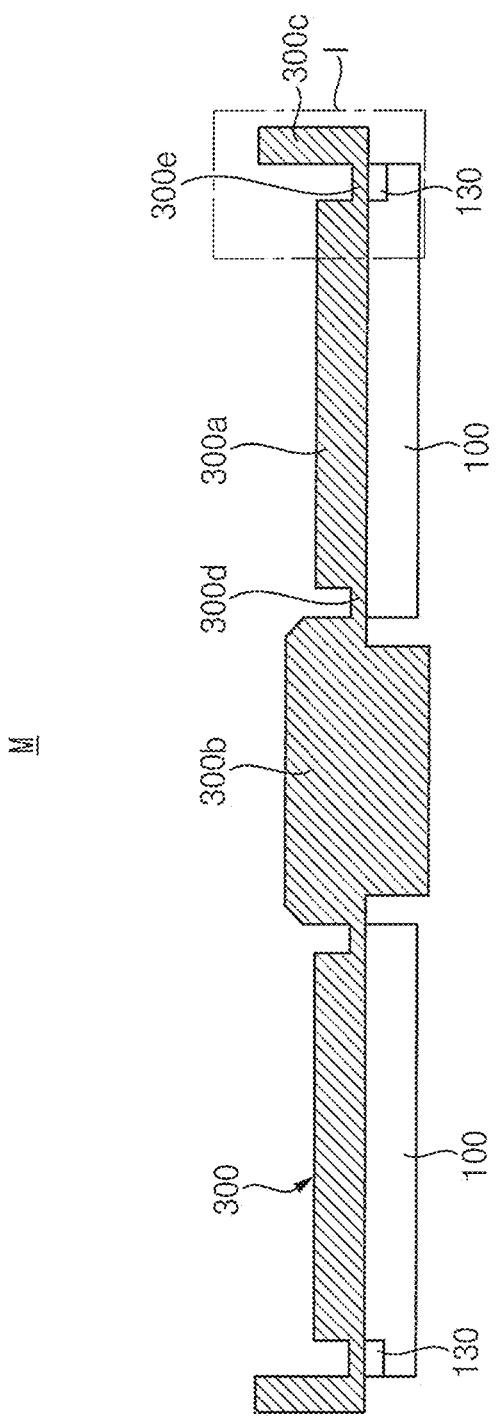
Figure 28:
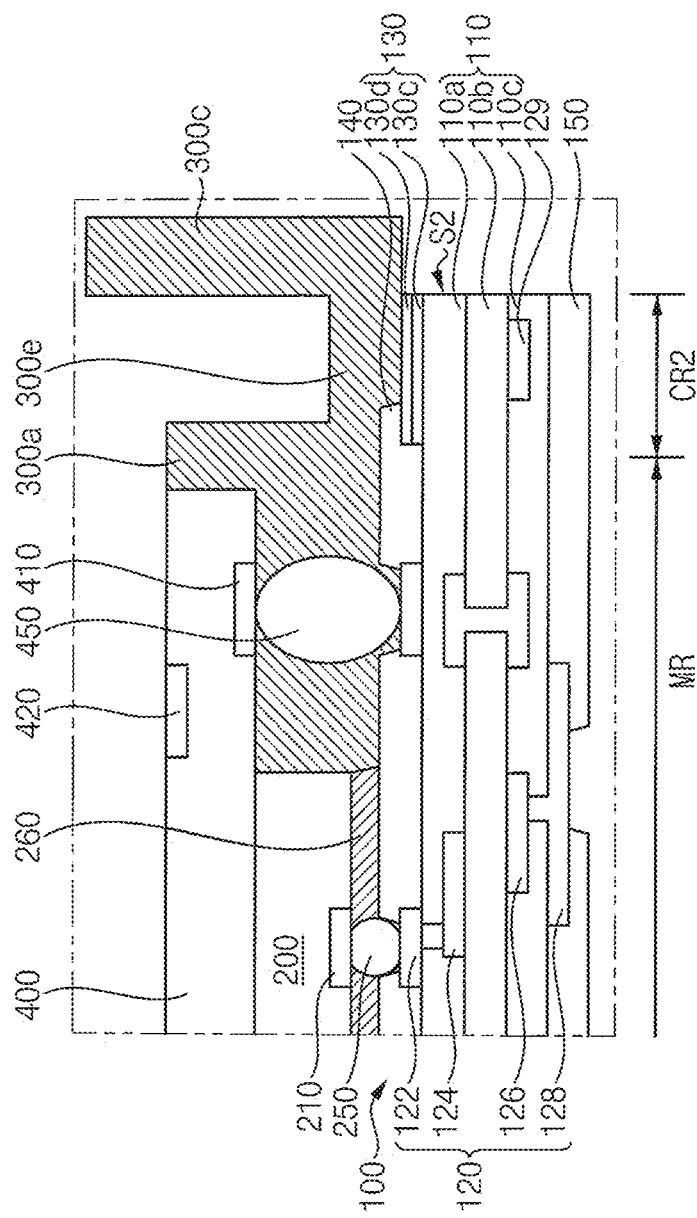
Figure 29:
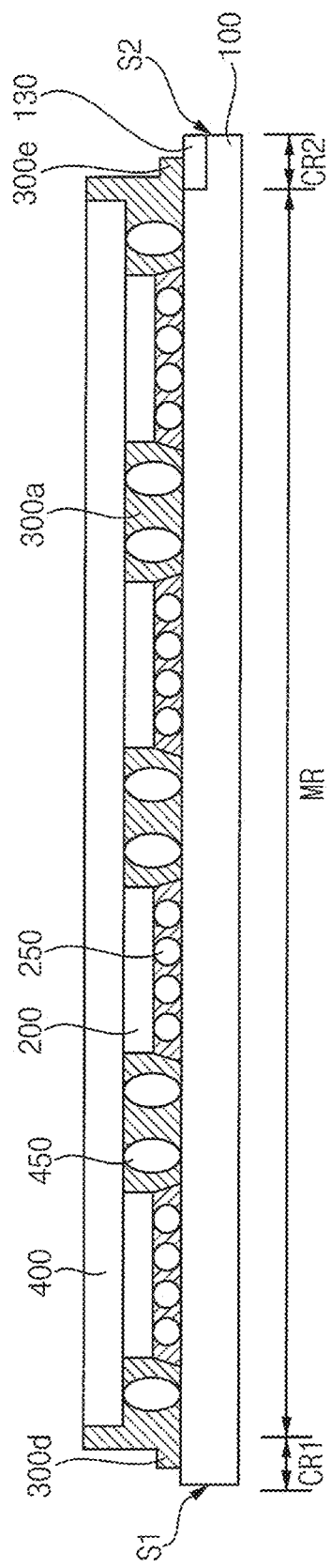

FIGS. 22 to 31 are views illustrating a method of manufacturing a semiconductor package in accordance with an example embodiment. FIG. 22 is a plan view illustrating a portion of a strip substrate on which semiconductor chips are bonded. FIG. 23 is a cross-sectional view illustrating an interposer substrate on which conductive connection bumps are formed. FIG. 24 is a cross-sectional view illustrating then interposer substrate mounted on the strip substrate of FIG. 22 through the conductive connection bumps. FIG. 25 is an enlarged cross-sectional view illustrating a portion G in FIG. 24. FIG. 26 is a plan view illustrating a molded product for semiconductor strip including a molding member formed on the strip substrate of FIG. 22. FIG. 27 is a cross-sectional view taken along the line H-H' in FIG. 26. FIG. 28 is an enlarged cross-sectional view illustrating a portion I in FIG. 27. FIG. 29 is a cross-sectional view illustrating a semiconductor strip including a molding member from which a curl portion and a dummy curl portion in FIG. 26 are removed.

Referring to FIG. 22, first, processes the same as or similar to the processes described with reference to FIGS. 9 to 12 may be performed to mount at least one semiconductor chip 200 on a substrate 100.

In some example embodiments, the substrate 100 may include a plurality of adhesion reducing pads 130 disposed in a second direction (Y direction) along a second side portion S2 in a second cutting region CR2. The adhesion reducing pad 130 may include an organic coating layer 130d exposed by a first passivation layer pattern 140. The organic coating layer 130d may be formed on a metal layer 130c.

For example, the organic coating layer 130d may include an organic solder mask (Organic Solderability Preservatives, OSP). In this case, the metal layer 130c may include a copper foil layer, and the organic coating layer 130d having a uniform film may be formed by chemically reacting an organic compound on a surface of the metal layer 130c. Examples of the organic compound may be alkylbenzimidazole, di-phenylimidazole, etc. A thickness of the organic coating layer 130d may be within a range of 0.1 μm to 0.3 μm.

The organic coating layer 130d may protect the surface of the metal layer 130c from external air and moisture, and may provide low adhesion with a sealing material EMC.

Referring to FIG. 23, conductive connection members 450 may be formed on an interposer substrate 400.

In some example embodiments, the interposer substrate 400 may be a redistribution interposer having a first surface 402 and a second first surface 404 facing each other. The interposer substrate 400 may be a multilayer circuit board having vias and various circuits therein. The interposer substrate 400 may include internal wirings as channels for electrical connection with the substrate 100. First and second connection pads 410 and 420 (see FIG. 25) may be provided on the first surface 402 and the second surface 404 of the interposer substrate 400 respectively. The first and second connection pads 410 and 420 may be electrically connected to each other by the internal wirings.

The conductive connection members 450 may be bonded to the first connection pads 410 provided on the first surface 402 of the interposer substrate 400 respectively. For example, the conductive connection members 450 may include C4 bumps.

Referring to FIGS. 24 and 25, the interposer substrate 400 may be disposed on the semiconductor chips 200 on the substrate 100.

In some example embodiments, the interposer substrate 400 may be disposed on the substrate 100 via the conductive connection members 450. The interposer substrate 400 may be disposed such that the first surface 402 faces the substrate 100. The conductive connection member 450 may be disposed between the first connection pad 410 of the interposer substrate 400 and a substrate pad of the substrate 100 to electrically connect them. Accordingly, the interposer substrate 400 may be electrically connected to the substrate 100 by the conductive connection members 450.

The interposer substrate 400 may be disposed on the semiconductor chips 200. The first surface 402 of the interposer substrate 400 may be disposed to be contact with upper surfaces of the semiconductor chips 200. Alternatively, the first surface 402 of the interposer substrate 400 may be disposed to be spaced apart from the upper surfaces of the semiconductor chips 200. An adhesive film may be interposed between the first surface 402 of the interposer substrate 400 and the upper surface of the semiconductor chip 200.

Referring to FIGS. 26 to 28, a molding member 300 covering the semiconductor chips 200 may be formed on the substrate 100.

In some example embodiments, processes the same as or similar to the processes described with reference to FIGS. 13 to 15 may be performed to form the molding member 300 on the substrate 100.

The molding member 300 formed on the substrate 100 may include a sealing portion 300a, a curl portion 300b, a dummy curl portion 300c, a plurality of gate runner portion 300d and a plurality of dummy runner portions 300e.

The sealing portion 300a may cover side surfaces of the interposer substrate 400 and side surfaces of the semiconductor chips 200. The second surface 404 of the interposer substrate 400 may be exposed by the sealing portion 300a.

The gate runner portions 300d may be formed in gate runner regions GR to be contact with the first passivation layer pattern 140 respectively. The dummy runner portions 300e may be formed in dummy runner regions DR to be contact with the adhesion reducing pads 130 respectively. The adhesive force between the dummy runner portion (EMC) 300e and the adhesion reducing pad (OSP) 130 may be much smaller than the adhesive force between the gate runner portion (EMC) 300d and the first passivation layer pattern (solder resist) 130.

Referring to FIG. 29, the curl portion 300b and the dummy curl portion 300c of the molding member 300 may be removed.

In some example embodiments, processes the same as or similar to the processes described with reference to FIGS. 16 and 17 may be performed to remove the dummy curl portion 300c and the curl portion 300b from the molding member 300 to form a semiconductor strip S.

When the dummy curl portion 300c is removed, only at least portions of the dummy runner portions 300e may be removed together and remaining portions of the dummy runner portions 300e may remain in the second cutting region CR2 of the substrate 100. When the curl portion 300b is removed, at least portions of the gate runner portions 300d are removed together and remaining portions of the gate runner portions 300d may remain in the first cutting region CR1 of the substrate 100.

The portion of the dummy runner portion 300e remaining after being cut may not protrude outward from the second side portion S2 of the substrate 100, but may be positioned inward from the second side portion S2. Since the adhesive force between the dummy runner portion 300e and the adhesion reducing pad 130 is relatively small, the dummy runner portion 300e on the adhesion reducing pad 130 may be easily peeled off to limit and/or prevent a bur from occurring to protrude outward from the second side portion S2 of the substrate 100.

Figure 30:
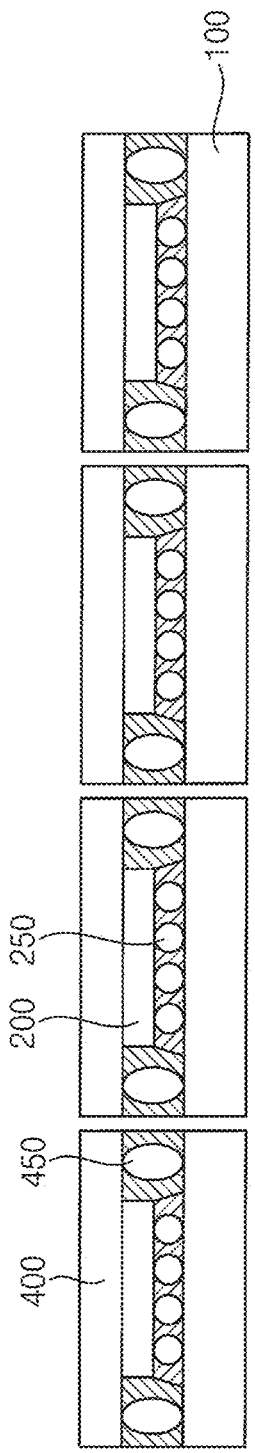

Referring to FIG. 30, the semiconductor strip S may be cut by a sawing process to form a lower package including the interposer substrate 400 disposed therein.

In some example embodiments, external connection members 180 such as solder balls may be disposed on external connection pads on a lower surface of the substrate 100, and the substrate 100 may be cut using a cutting device such as a blade to remove the first and second cut regions CR1 and CR2.

Then, the mounting region MR of the substrate 100 may be cut by the sawing process to separate individual lower packages.

Figure 31:
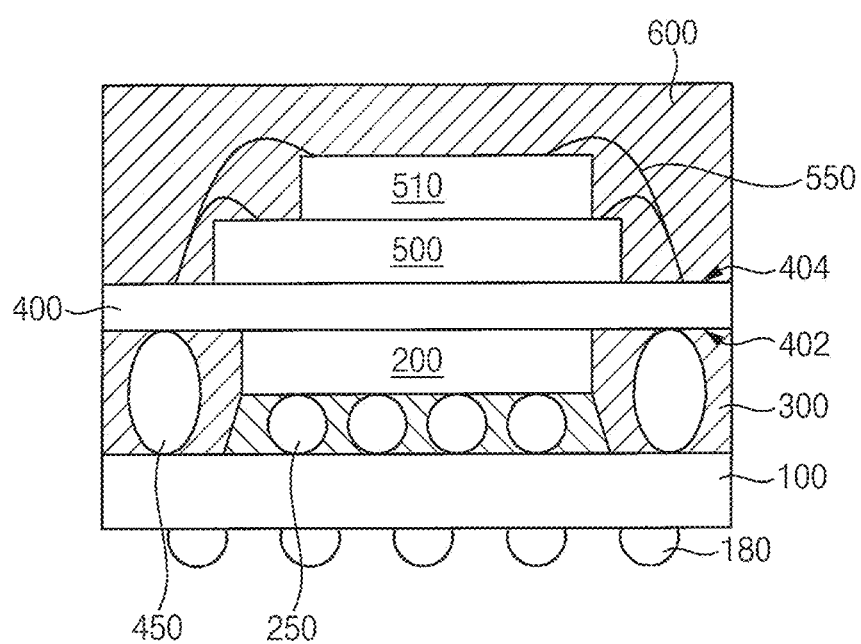

Referring to FIG. 31, an upper package may be stacked on the lower package.

In some example embodiments, second and third semiconductor chips 500 and 510 may be stacked on the second surface 404 of the interposer substrate 400. The second and third semiconductor chips 500 and 510 may be stacked on the interposer substrate 400 by adhesive members. The second and third semiconductor chips 500 and 510 may include memory chips. For example, the memory chip may include a nonvolatile memory device such as a DRAM or a NAND flash memory.

Then, chip pads of the second and third semiconductor chips 500 and 510 may be connected to the second connection pads of the interposer substrate 400 by bonding wires 550. Accordingly, the second and third semiconductor chips 500 and 510 may be electrically connected to the interposer substrate 400 by the bonding wires 550.

Then, a second sealing member 600 may be formed on the interposer substrate 400 to cover the second and third semiconductor chips 500 and 510.

Although the upper package includes two semiconductor chips mounted by a wire bonding method, it will be understood that the type, number, and mounting method of the semiconductor chips of the upper package are not limited thereto.

The above method of manufacturing a semiconductor package may be used to manufacture a semiconductor package including a logic device and/or a memory device.

The semiconductor package may include semiconductor devices such as logic devices and/or memory devices. The semiconductor package may include logic devices such as central processing units (CPUs), main processing units (MPUs), or application processors (APs), or the like, and/or volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and aspects of embodiments of inventive concepts. Accordingly, all such modifications are intended to be included within the scope of example embodiments as defined in the claims.

What is claimed is:

1. A method of manufacturing a semiconductor package, comprising:
   providing a substrate, the substrate having a first cutting region and a second cutting region respectively provided along a first side portion and a second side portion opposite each other and a mounting region between the first cutting region and the second cutting region, the substrate including adhesion reducing pads in the second cutting region;
   disposing at least one semiconductor chip on the mounting region of the substrate;
   forming a molding member on the substrate, the molding member including a sealing portion on the mounting region of the substrate and covering the at least one semiconductor chip, a dummy curl portion outside the second side portion of the substrate, and a plurality of dummy runner portions on the second cutting region to connect the sealing portion and the dummy curl portion, the plurality of dummy runner portions being on the adhesion reducing pads to reduce an adhesive force between the substrate and the plurality of dummy runner portions; and
   removing the dummy curl portion and at least portions of the dummy runner portions from the molding member.

2. The method of claim 1, wherein each of the adhesion reducing pads includes at least two metal layers stacked on each other.

3. The method of claim 2, wherein each of the metal layers of the adhesion reducing pads includes nickel (Ni) and gold (Au).

4. The method of claim 1, wherein a thickness of at least one of the adhesion reducing pads is within a range of 2 μm to 10 μm.

5. The method of claim 1, wherein the adhesion reducing pads include an organic coating layer.

6. The method of claim 5, wherein the organic coating layer includes an organic solder mask (OSP).

7. The method of claim 5, wherein a thickness of the organic coating layer is within a range of 0.1 μm to 0.3 μm.

8. The method of claim 1, wherein a width of at least one of the adhesion reducing pads is within a range of 1 mm to 3 mm.

9. The method of claim 1, wherein the molding member further includes a curl portion outside the first side portion of the substrate and a plurality of gate runner portions provided on the first cutting region to connect the sealing portion and the curl portion.

10. The method of claim 1, further comprising:
    removing the first cutting region and the second cutting region of the substrate.

11. A method of manufacturing a semiconductor package, comprising:
    providing a substrate, the substrate having a first side portion and a second side portion opposite each other and a plurality of adhesion reducing pads spaced apart from each other along the second side portion;
    disposing at least one semiconductor chip on the substrate;
    disposing the substrate in a mold defining a cavity, a plurality of dummy runners, and dummy curl in fluid communication with each other,
       the cavity configured to receive a sealing material for sealing the at least one semiconductor chip, the plurality of dummy runners configured to serve as pathways through which the sealing material is discharged from the cavity, and the dummy curl configured to be used for collecting the sealing material discharged through the dummy runners;
    forming a molding member of the substrate by injecting the sealing material into the cavity of the mold and using the dummy curl for collecting the sealing material discharged from the cavity through the plurality of dummy runners,
       the molding member including a sealing portion that covers the at least one semiconductor chip, a dummy curl portion outside the second side portion of the substrate, and a plurality of dummy runner portions connecting the sealing portion and the dummy curl portion,
       the plurality of dummy runner portions respectively contacting portions of the adhesion reducing pads; and
    removing the dummy curl portion and at least portions of the plurality of dummy runner portions from the molding member.

12. The method of claim 11, wherein
    the mold further includes a curl and a plurality of gate runners in fluid communication with each other and the cavity,
    the curl is configured to receive the sealing material via injection, and
    the plurality of gate runners are configured to serve as pathways through which the sealing material is introduced from the curl to the cavity.

13. The method of claim 12, wherein
    the molding member further includes a curl portion and a plurality of gate runner portions,
    the curl portion is outside the first side portion of the substrate, and
    the plurality of gate runner portions connect the sealing portion and the curl portion.

14. The method of claim 13, further comprising:
    removing the curl portion and at least portions of the plurality of gate runner portions from the molding member.

15. The method of claim 11, wherein each of the adhesion reducing pads includes at least two metal layers stacked on each other.

16. The method of claim 11, wherein the adhesion reducing pads include an organic coating layer.

17. The method of claim 16, wherein the organic coating layer include an organic solder mask (OSP).

18. The method of claim 11, wherein a width of at least one of the adhesion reducing pads is within a range of 1 mm to 3 mm.

19. The method of claim 11, further comprising:
after the disposing the at least one semiconductor chip on the substrate, disposing an interposer substrate on the at least one semiconductor chip.

20. The method of claim 19, further comprising:
disposing at least one second semiconductor chip on the interposer substrate.

* * * * *